US010128083B2

(12) United States Patent
Druz et al.

(10) Patent No.: US 10,128,083 B2
(45) Date of Patent: Nov. 13, 2018

(54) ION SOURCES AND METHODS FOR GENERATING ION BEAMS WITH CONTROLLABLE ION CURRENT DENSITY DISTRIBUTIONS OVER LARGE TREATMENT AREAS

(71) Applicant: Veeco Instruments Inc., Plainview, NY (US)

(72) Inventors: Boris Druz, Brooklyn, NY (US); Rustam Yevtukhov, Briarwood, NY (US); Robert Hieronymi, Monroe, NY (US); Alan V. Hayes, Great Neck, NY (US); Mathew Levoso, Bellmore, NY (US); Peter Porshnev, Northport, NY (US)

(73) Assignee: VEBCO INSTRUMENTS INC., Fairview, NY (US)

( * ) Notice: Subject to any disclaimer, the term of this patent is extended or adjusted under 35 U.S.C. 154(b) by 47 days.

(21) Appl. No.: 15/170,570

(22) Filed: Jun. 1, 2016

(65) Prior Publication Data

US 2017/0352521 A1    Dec. 7, 2017

(51) Int. Cl.
*H01J 37/08* (2006.01)
*H01J 37/305* (2006.01)
*H01J 27/18* (2006.01)

(52) U.S. Cl.
CPC .......... *H01J 37/3053* (2013.01); *H01J 27/18* (2013.01); *H01J 37/08* (2013.01); *H01J 2237/0802* (2013.01)

(58) Field of Classification Search
CPC ........ H01J 37/08; H01J 27/18; H01J 37/3053; H01J 2237/0815; H01J 37/32082
See application file for complete search history.

(56) References Cited

U.S. PATENT DOCUMENTS

| 4,911,814 | A | * | 3/1990 | Matsuoka | ............. | C23C 14/357 |
| | | | | | | 204/192.12 |
| 5,021,919 | A | * | 6/1991 | Engemann | ............. | H01J 27/18 |
| | | | | | | 156/345.42 |
| 5,022,977 | A | * | 6/1991 | Matsuoka | ............... | H01J 27/18 |
| | | | | | | 204/192.12 |
| 6,346,768 | B1 | | 2/2002 | Proudfoot | | |
| 6,664,547 | B2 | | 12/2003 | Benveniste | | |
| 6,803,585 | B2 | | 10/2004 | Glukhoy | | |
| 7,557,362 | B2 | | 7/2009 | Yevtukhov et al. | | |
| 7,863,582 | B2 | | 1/2011 | Godyak | | |
| 7,931,748 | B2 | | 4/2011 | Veerasamy et al. | | |
| 7,969,096 | B2 | * | 6/2011 | Chen | ..................... | H01J 37/321 |
| | | | | | | 315/111.21 |
| 8,076,650 | B2 | * | 12/2011 | Smith | ................. | C23C 14/0031 |
| | | | | | | 250/423 F |

(Continued)

FOREIGN PATENT DOCUMENTS

JP          3071814 B2    7/2000

*Primary Examiner* — Wyatt Stoffa
(74) *Attorney, Agent, or Firm* — Holzer Patel Drennan

(57) ABSTRACT

The presently disclosed ion sources include one or more electromagnets for changing the distribution of plasma within a discharge space of an ion source. At least one of the electromagnets is oriented about an outer periphery of a tubular sidewall of the ion source and changes a distribution of the plasma in a peripheral region of the discharge space.

20 Claims, 21 Drawing Sheets

(56) References Cited

U.S. PATENT DOCUMENTS

| | | | | |
|---|---|---|---|---|
| 8,157,976 B2* | 4/2012 | Druz | ..................... | C23C 14/165 |
| | | | | 118/723 IR |
| 8,158,016 B2* | 4/2012 | Hayes | ..................... | H01J 27/18 |
| | | | | 216/59 |
| 8,409,400 B2* | 4/2013 | Wi | ..................... | H01J 37/32357 |
| | | | | 118/723 I |
| 2003/0020411 A1* | 1/2003 | Strang | ................... | H01J 37/321 |
| | | | | 315/111.41 |
| 2004/0085246 A1* | 5/2004 | Howald | ................ | H01J 37/321 |
| | | | | 343/701 |
| 2005/0000655 A1* | 1/2005 | Wi | ....................... | H01J 37/321 |
| | | | | 156/345.48 |
| 2005/0093460 A1* | 5/2005 | Kim | ..................... | H01J 37/321 |
| | | | | 315/111.21 |
| 2007/0194245 A1* | 8/2007 | Yevtukhov | .............. | H01J 27/18 |
| | | | | 250/396 ML |
| 2008/0179284 A1* | 7/2008 | Hayes | ..................... | H01J 27/18 |
| | | | | 216/61 |
| 2009/0114154 A1* | 5/2009 | Nakagawara | ........... | C23C 14/32 |
| | | | | 118/723 ME |
| 2010/0003423 A1* | 1/2010 | Nakagawara | ......... | C23C 14/081 |
| | | | | 427/571 |
| 2010/0029024 A1* | 2/2010 | Miyake | ................. | H01J 37/321 |
| | | | | 438/16 |
| 2010/0155223 A1* | 6/2010 | Gung | .................... | C23C 14/046 |
| | | | | 204/192.3 |
| 2012/0211166 A1* | 8/2012 | Yevtukhov | .............. | H01J 27/18 |
| | | | | 156/345.51 |
| 2013/0228701 A1* | 9/2013 | Fukuda | ................. | H01J 37/145 |
| | | | | 250/440.11 |
| 2015/0144808 A1* | 5/2015 | Ribton | .................... | H01J 27/18 |
| | | | | 250/493.1 |
| 2015/0303032 A1* | 10/2015 | Godyak | ............... | H01J 37/321 |
| | | | | 156/345.35 |
| 2015/0357167 A1* | 12/2015 | Lee | .................... | H01J 37/32678 |
| | | | | 118/723 MP |
| 2016/0076142 A1* | 3/2016 | Sheng | .................. | H01J 37/317 |
| | | | | 438/766 |
| 2016/0093463 A1* | 3/2016 | Bhattacharjee | ........ | H01J 27/18 |
| | | | | 315/111.31 |
| 2016/0181068 A1* | 6/2016 | Hori | ........................ | C23C 14/24 |
| | | | | 118/723 MP |
| 2017/0032927 A1* | 2/2017 | Koo | ........................ | H01J 37/14 |

* cited by examiner

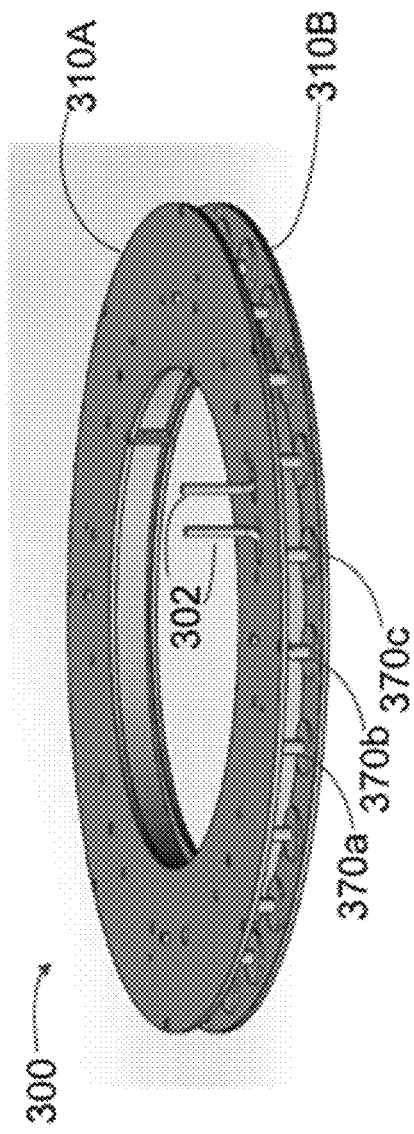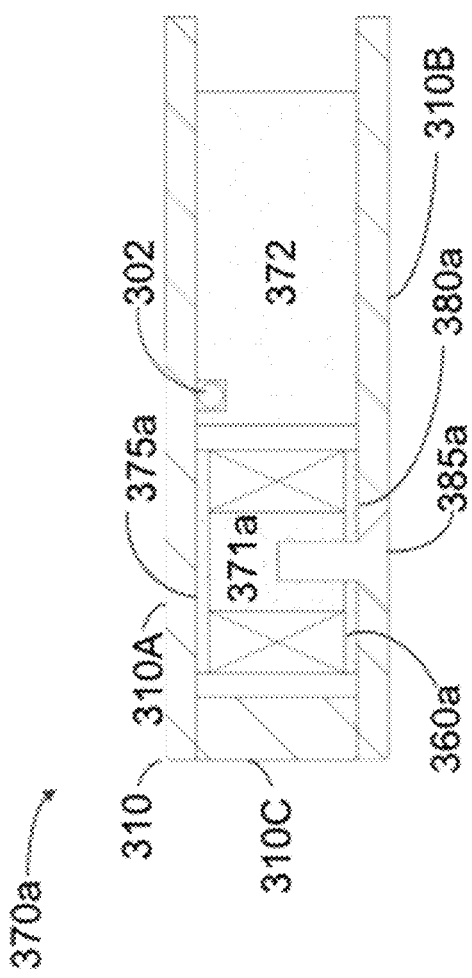
FIG. 2A
FIG. 2B

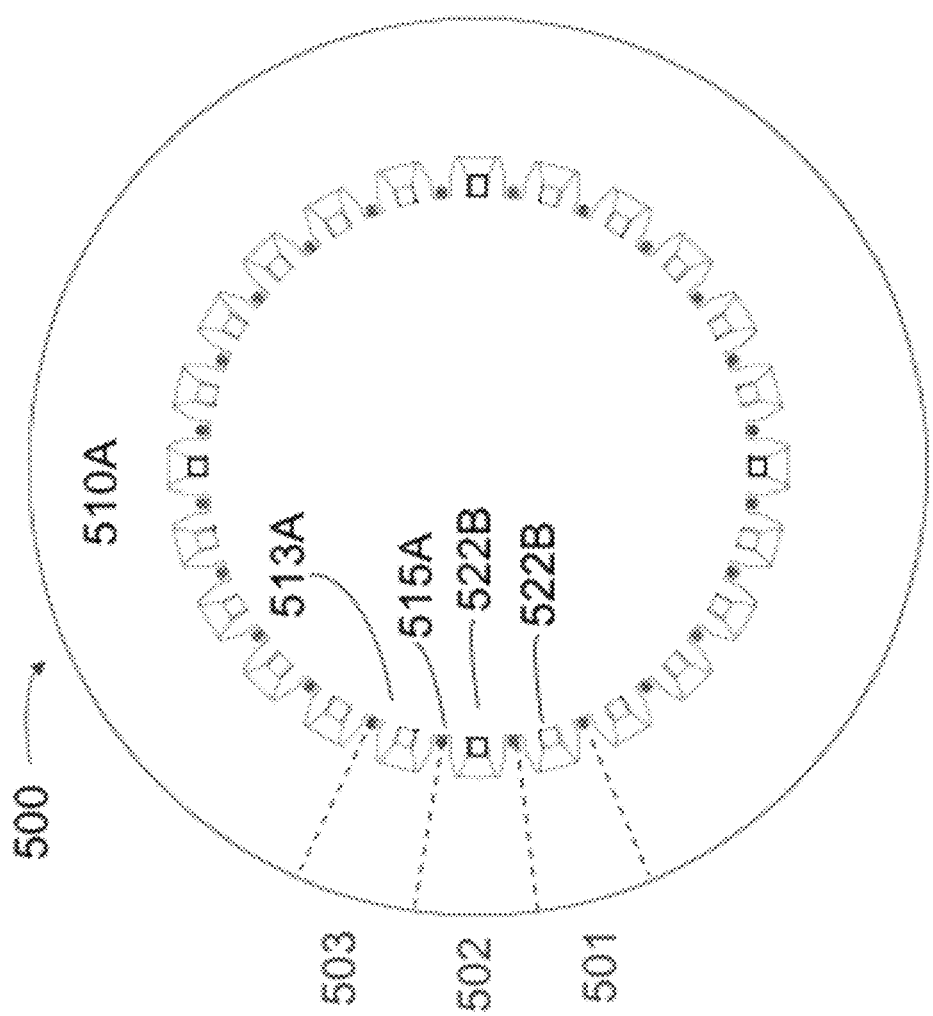

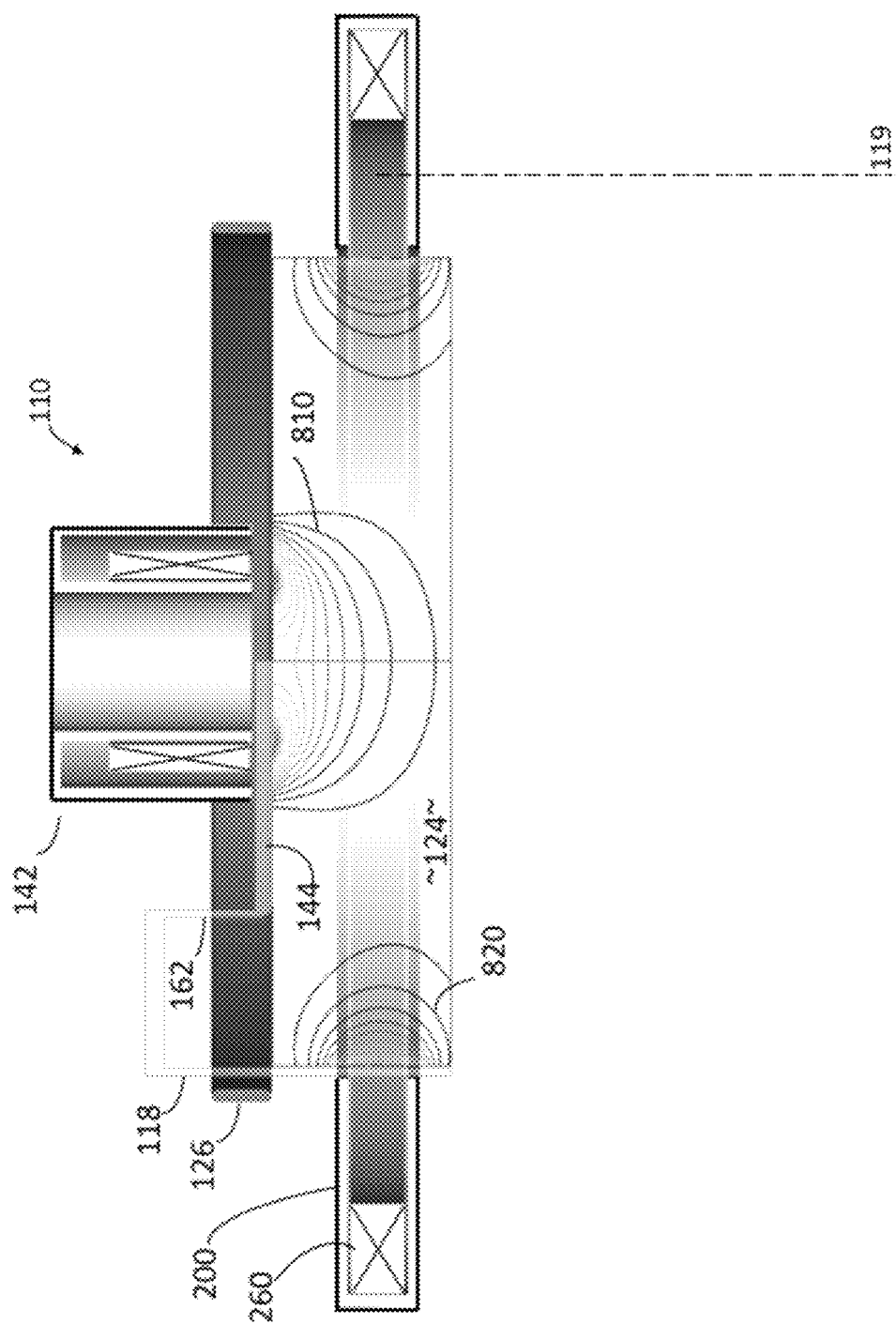

| Vb | Uniformity (Range/Mean) | |
|---|---|---|
| | Electromagnets off: Itor = Icen = 0 | Electromagnets on |
| 100V | 4.45% | 2.37% |
| 1200V | 10.98% | 3.72% |
| 1500V | 11.15% | 3.64% |

FIG. 10D

ION SOURCES AND METHODS FOR GENERATING ION BEAMS WITH CONTROLLABLE ION CURRENT DENSITY DISTRIBUTIONS OVER LARGE TREATMENT AREAS

BACKGROUND

Ion beam processing systems are used in a variety of applications for modifying the properties of a substrate during the fabrication of thin film devices, such as semiconductor and data storage devices. In particular, one or more etching processes may be used to remove and shape layers of material on the substrate. One conventional etching procedure involves the use of a working gas that is ionized into a plasma state at low pressures (i.e., at pressures less than about 1 mTorr). Ions are extracted from the plasma and accelerated toward the substrate by ion optics for ion beam etching ("IBE") of the layers of material.

As device critical dimensions shrink, the need for improved process uniformity without sacrificing beam directionality has driven the search for improved ion sources. IBE uniformity is directly related to the beam current density and the distributions of ions and energetic neutrals, wherein charged ions are converted to neutrals during beam transport via charge exchange ion-atom collisions. The integrated beam particle flux should be independent of the impact position on the substrate. The angular distributions of the charged and neutral beam particles at the substrate are directly related to the angular properties of the trajectories of the ions extracted from the plasma by the optics of the source. To optimize process uniformity, the incident particle trajectories should be approximately parallel across the surface of the substrate.

Conventional ion sources of more recent design utilize a helical or coil antenna wrapped about a discharge vessel to generate an inductively coupled plasma ("ICP") using high frequency electromagnetic field energy, including, for example, radio-frequency ("rf") electromagnetic energy. The antenna of the ion source, when carrying an oscillating high frequency current, induces a time-varying magnetic field inside the discharge vessel. In accordance with Faraday's law, the time-varying magnetic field induces a solenoidal, high frequency electric field that accelerates electrons in an azimuthal direction within the discharge vessel and sustains the ICP. In such manner, the RF-ICP source may generate relatively high plasma densities, such as on the order of $10^{11}$ cm$^{-3}$. To provide the initial "seed" electrons required to ignite the RF-ICP source, the plasma may be ignited by imbibing electrons generated by an electron source in the process chamber during the start-up period. Alternatively, an igniter may be provided within the plasma generator. This igniter may be a pair of electrodes attached to a spark generator.

Because low pressure ICPs are diffusion dominated, the plasma density and, thus the radial plasma ion flux distribution at the ion optics plane, is invariably convex, i.e., largest at the center of the ion source and decreasing radially outwardly from the center of the ion source. This results in non-uniform ion current density distribution of broad ion beams generated by such conventional ion sources.

Typical broad beam ion sources utilize a multi-electrode accelerator system for forming and accelerating the ions into a beam. The electrodes in this system are flat or dished multi-aperture plates, typically called grids, perforated with an array of aligned apertures through which ion beamlets are extracted. Overlap of these beamlets results in a single broad ion beam. One known method of compensating for the effect on the plasma density profile of the plasma non-uniformities described above is to radially vary the transparency of the grids so as to decrease the beam current density in the center. However, this compensation method has several limitations. Variations in the transparency of the ion optics cannot compensate for variations in the plasma density profile for different ion source operating conditions (e.g., rf power, beam voltage and current, gas type and pressure), for any time dependence of these factors between system maintenance periods, or for variations in source and ion optics. The variations in source and ion optics may be either short and/or long term service condition changes in a given etch module because of the effect of mass and thermal loads, or module-to-module variations due to differences in ion source or grid construction. In some instances, a concave or convex beam ion density distribution may be desirable so as to compensate for variations in other aspects of processing of the substrates, including, for example, beam spreading during transport to the substrate, clamp effects at the periphery of the substrate, variations in the thickness of the material layer being etched, or variations in the width of the etch mask features.

Localized variations in the radial and/or azimuthal density distributions of the plasma typically limit the uniformity of the IBE process. The location and shape of these variations are dependent on the operating conditions. The transparency of the grid optics cannot be easily modified to compensate for this dependence on operating conditions.

Known conventional devices may further include features for tuning ion flux uniformity within a grid-based RF-inductively coupled ion source. Such features may use a re-entrant vessel, positioned at a predetermined distance from a screen grid of the grid-assembly. By decreasing the predetermined distance, the ion flux within the center of the ion source may be suppressed. Additionally, extensions may be included to fine tune radial variations in the ion flux distribution so as to flatten out any asymmetric peaks in the plasma distribution. Another known device employs a movable "plasma shaper" which extends from a re-entrant vessel and into the plasma discharge chamber to provide an extended range of tuning of the ion flux distribution.

Thus, there exists a need for ion sources with improved control of the ion flux distribution, particularly over spatial processing dimensions greater than 8 inches in diameter. More particularly, there exists a need for devices and methods that are amendable to controlling the ion beam current density distribution at the outer periphery of the ion flux density distribution. Furthermore, there exists a need for ion sources with improved range of adjustment of the beam profile and improved control of azimuthal variations in the ion flux distribution.

SUMMARY

The present invention overcomes the foregoing problems and other shortcomings and drawbacks of ion sources of the prior art. While the present invention will be described in connection with certain embodiments or implementations, it will be understood that the present invention is not limited to these embodiments or implementations. To the contrary, this invention includes all alternatives, modifications, and equivalents as may be included within the scope of the present invention.

The present invention relates to devices for and methods of operating multiple electromagnets of an ion source to generate an ion beam with tailored operating characteristics.

One implementation of the presently disclosed technology includes an ion source comprising: a discharge chamber with a discharge space adapted to contain a working gas, the discharge chamber including a closed end, an open end, and a tubular sidewall extended between the closed end and the open end; an antenna adapted to generate a plasma from the working gas inside the discharge space; and a first electromagnet disposed at an outer periphery of the tubular sidewall of the discharge chamber for changing a distribution of the plasma inside the discharge space, wherein the first electromagnet is disposed and is adapted to primarily change the plasma distribution in a peripheral region of the discharge space.

Another implementation of the presently disclosed technology includes a method of operating an ion source comprising: generating a plasma within a discharge chamber of the ion source, the discharge chamber including a discharge space filled with a working gas, the discharge chamber including a closed end, an open end, and a tubular sidewall extended between the closed end and the open end; and controlling a first electromagnet disposed at an outer periphery of a tubular sidewall of the discharge chamber to primarily change a distribution of the plasma in a peripheral region of the discharge space.

Still another implementation of the presently disclosed technology includes an ion source comprising: a discharge chamber with a discharge space adapted to contain a working gas, the discharge chamber including a closed end, an open end, and a tubular sidewall extended between the closed end and the open end; an antenna adapted to generate a plasma from the working gas inside the discharge space; a first independently controlled electromagnet disposed within the closed end of the discharge chamber and adapted to primarily change a distribution of the plasma in a central region of the discharge space; a second independently controlled electromagnet disposed at an outer periphery of the tubular sidewall of the discharge chamber and adapted to primarily change a distribution of the plasma in a peripheral region of the discharge space.

According to yet another implementation, an ion source for plasma processing apparatus includes a discharge chamber with a discharge space to contain a working gas including a closed end, an open end, and a tubular sidewall extending between the closed and open ends. An antenna is adapted to generate plasma from a working gas inside the discharge chamber. At least two electromagnets are disposed proximate to the discharge chamber for changing the distribution of the plasma inside the discharge space using generated magnetic fields. At least one electromagnet is included within the closed end of the discharge chamber and is designed to primarily change the distribution of the plasma in the central region of the discharge space. The electromagnets include a first coil and a first magnetic flux concentrator, the latter formed from magnetically permeable material. The first coil is disposed proximate to a tubular sidewall of the first concentrator. The first coil is configured to be energized to generate a magnetic field. The first concentrator is configured to shape the magnetic flux generated by the first coil and localize it to the central region of the discharge space proximate to the center axis of the discharge chamber between closed and open ends. At least one other electromagnet is disposed at the periphery of the tubular sidewall of the discharge chamber designed to primarily change the plasma distribution in the peripheral region of the discharge space. It includes a second coil and a second magnetic flux concentrator formed from a magnetically permeable material. The second coil is configured to be energized to generate a magnetic field. The second concentrator is configured to shape the magnetic flux generated by the second coil and to localize it proximate to the peripheral region of the discharge space and near the open end of the discharge chamber.

In other implementations, the magnetic field strengths in the central and peripheral regions are adjusted by independently controlling the electrical current through coils of the first and second electromagnets, respectively. This changes the plasma distribution from the axis to periphery of the source at the open end of the discharge chamber. The first and second electromagnets are configured to be azimuthally isotropic and adjustment of the plasma distribution in the discharge chamber is radial.

In still other implementations the first and second electromagnets are multi-sectional and provide both radial and azimuthal adjustment of the plasma distribution in the discharge chamber.

Other implementations are also described and recited herein.

BRIEF DESCRIPTIONS OF THE DRAWINGS

The accompanying drawings, which are incorporated in and constitute a part of this specification, illustrate embodiments or implementations of the present invention and, together with a general description of the invention given above and the detailed description of the embodiments or implementations given below, serve to explain the principles of the present invention.

FIG. 2A is a partial perspective view of an example multi-sectional electromagnet assembly defining a toroidal electromagnet in which the single electromagnet of FIGS. 1A-C is replaced with an array of multiple sectional electromagnets disposed at the outer periphery of an ion source.

FIG. 2B is a representative cross-section of an example individual electromagnet of the multi-sectional electromagnet assembly of FIG. 2A.

FIG. 3A is a top view of an example toroidal ring cusp field electromagnet.

FIG. 5 illustrates example magnetic field contour maps for the central and toroidal electromagnets of FIG. 1A.

Figure 10A:
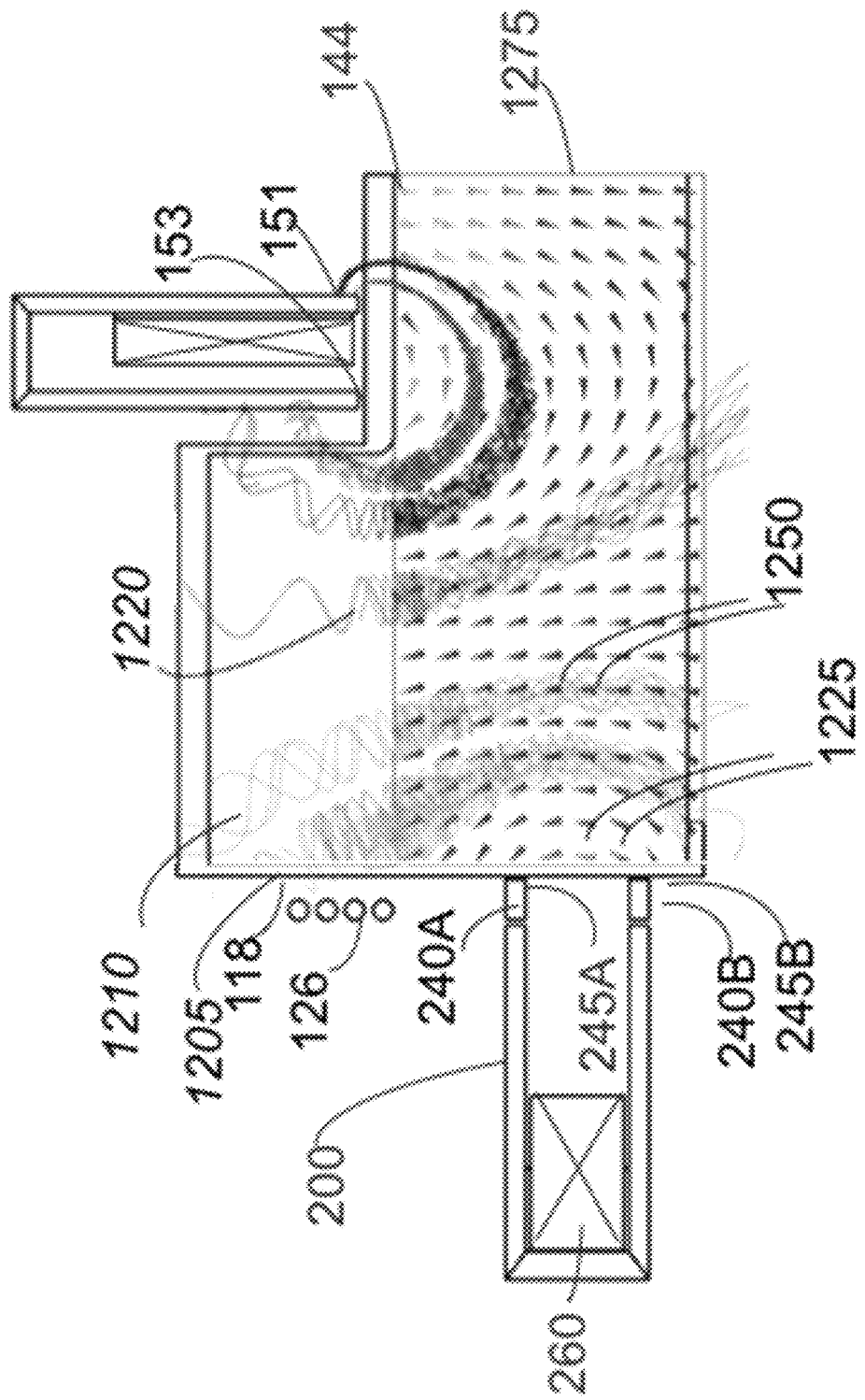
FIG. 10A illustrates an example modeled representative magnetic vector field distribution map and several sets of magnetized electron trajectories for the dual electromagnet configuration of FIG. 1.
Figure 10B:
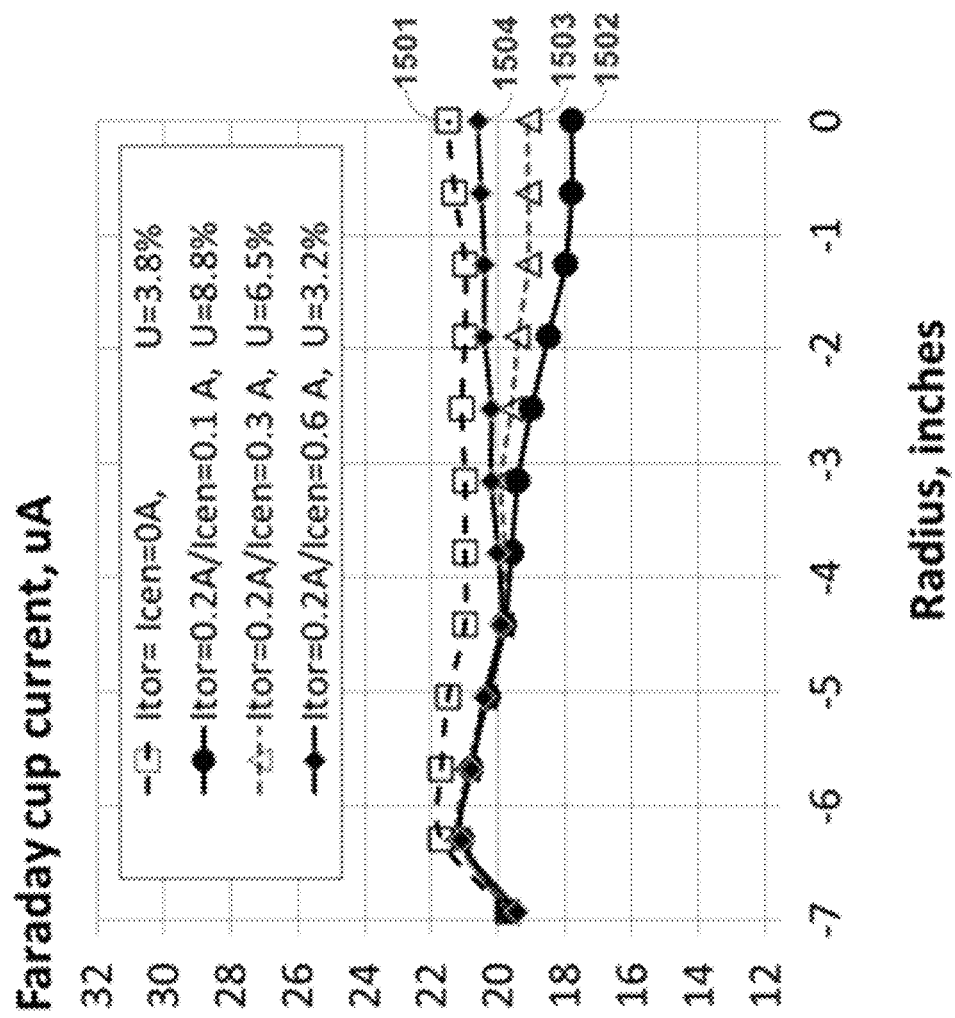
FIG. 10B illustrates an example of the effect of the example modeled representative magnetic vector field distribution map and magnetized electron trajectories of FIG. 10A on the ion beam current density distribution, as measured using a Faraday cup probe array.
Figure 10C:
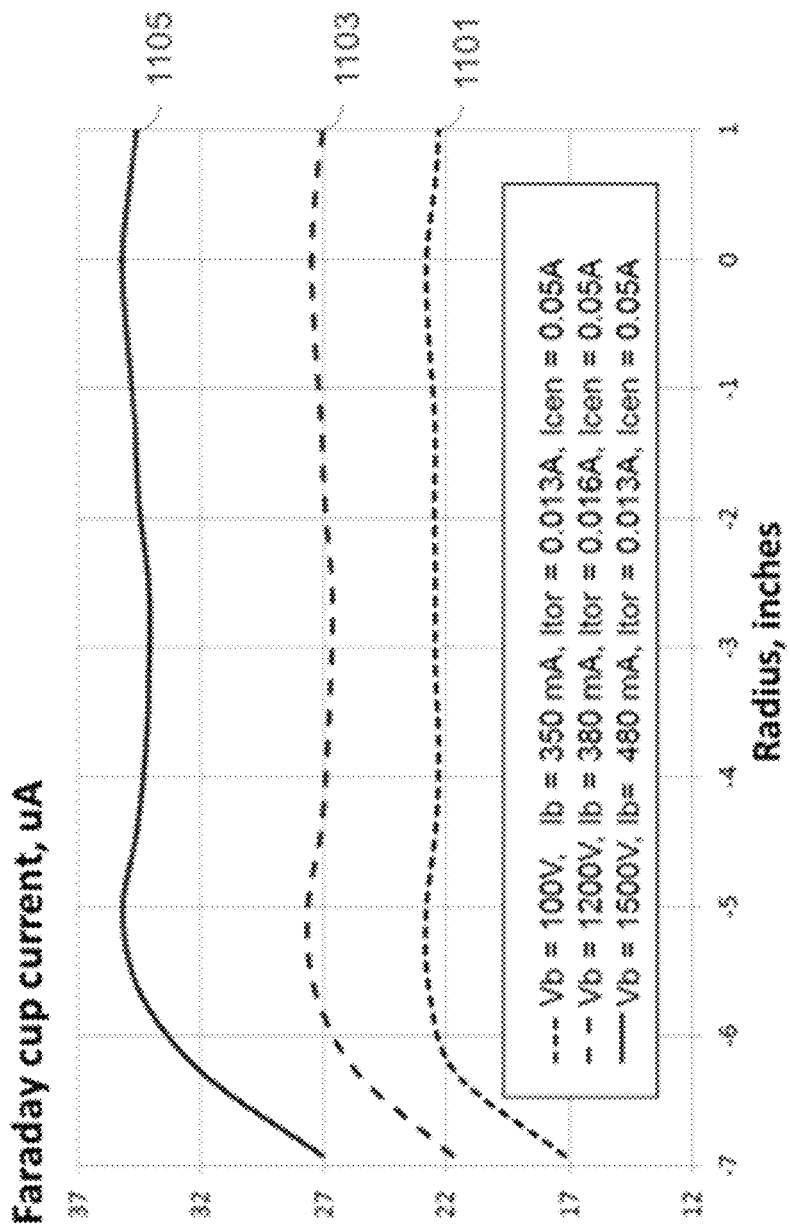
FIG. 10C illustrates additional examples of the effect of the modeled representative magnetic vector field distribution map and magnetized electron trajectories of FIG. 10A on the ion beam current density distribution for different beam voltages.

FIG. 10D compares the uniformity obtained for each of the beam profiles at optimized electromagnet current settings in FIG. 10C.

Figure 11A:
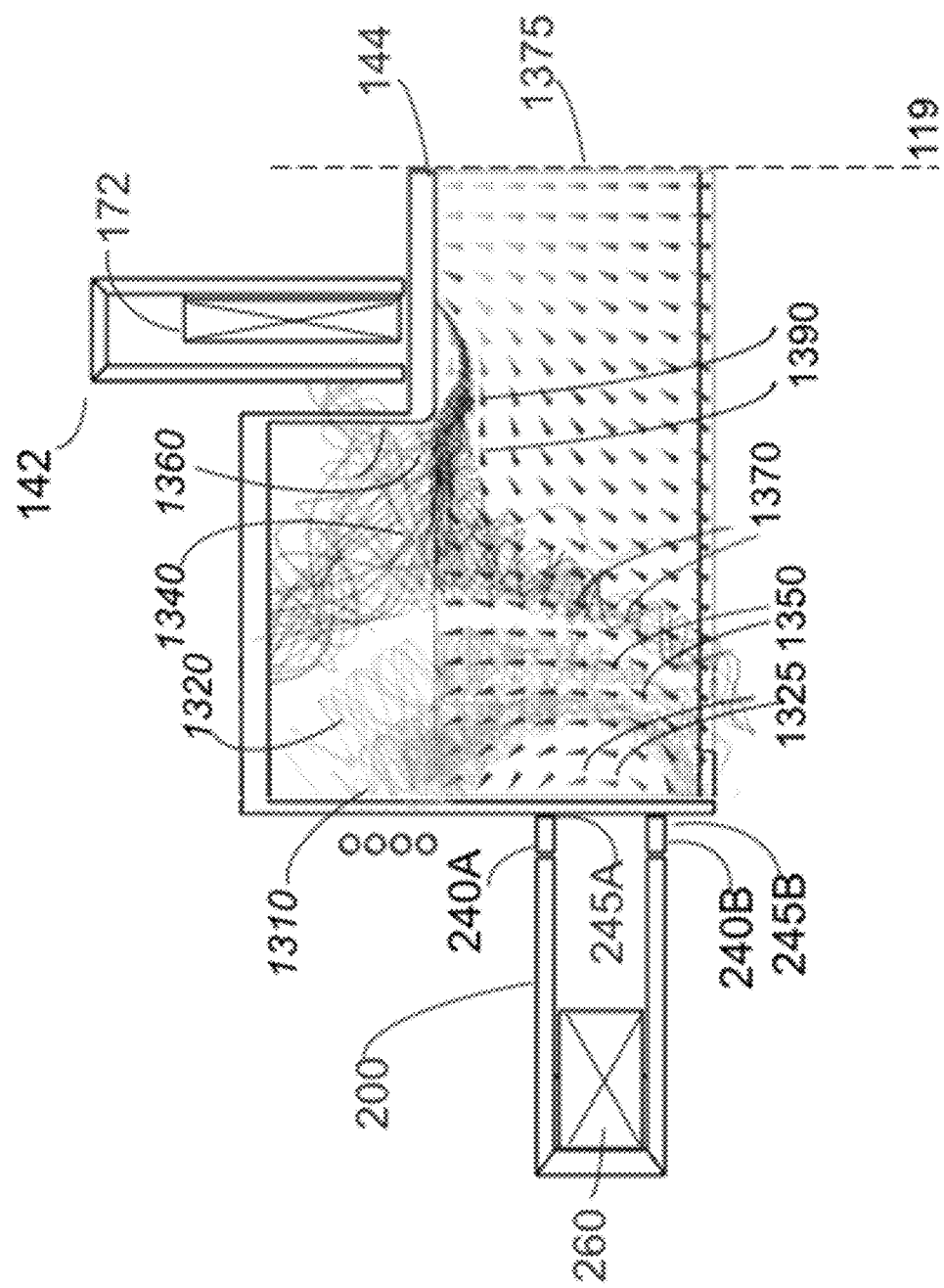

FIG. 11A illustrates another example modeled representative magnetic vector field distribution map and several sets of magnetized electron trajectories for the dual electromagnet configuration of FIG. 1.

Figure 11B:
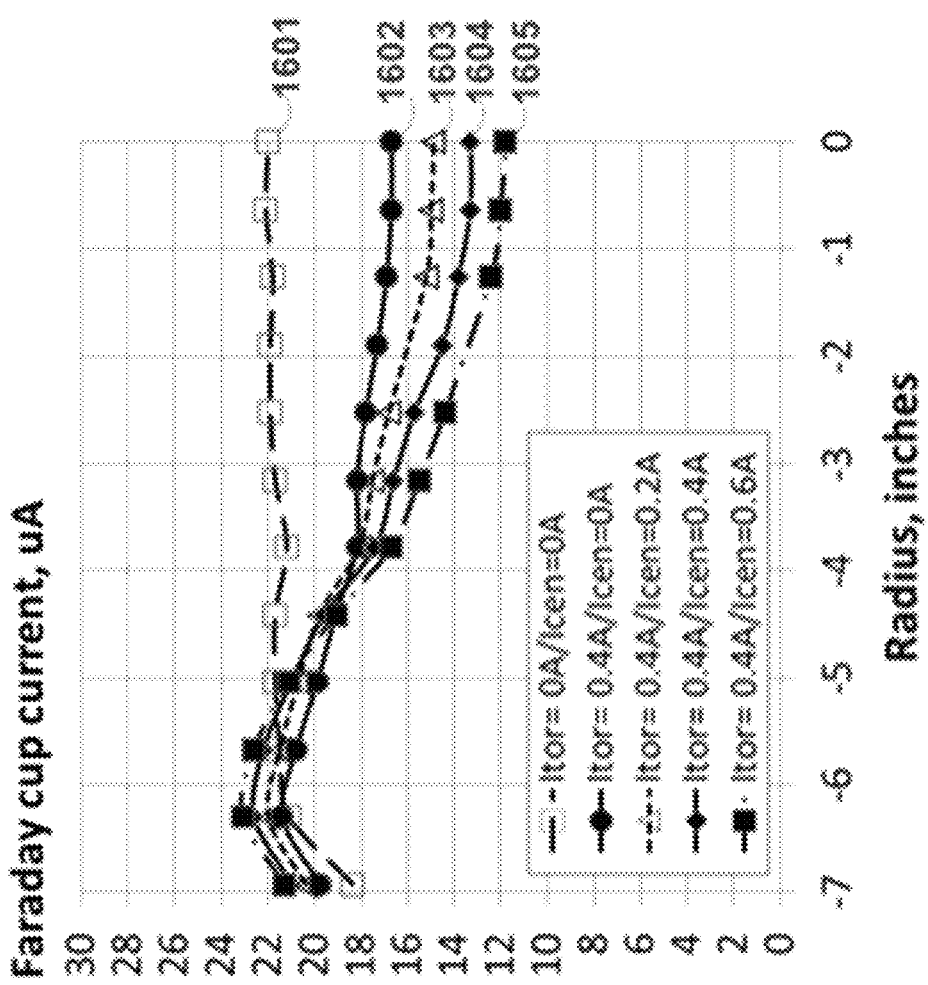

FIG. 11B illustrates the effect of the example modeled representative magnetic vector field distribution map and magnetized electron trajectories of of FIG. 11A on the ion beam current density distribution.

DETAILED DESCRIPTIONS

The presently disclosed technology provides a broad collimated uniform beam of ions from an array of low divergence charged particle beamlets, formed from ion optics structures of a gridded plasma-driven ion source. The beam ion current density distribution is adjustable through electromagnetic modification of the plasma density distribution in the ion source by two electromagnets located in different regions of the plasma discharge.

Figure 1A:
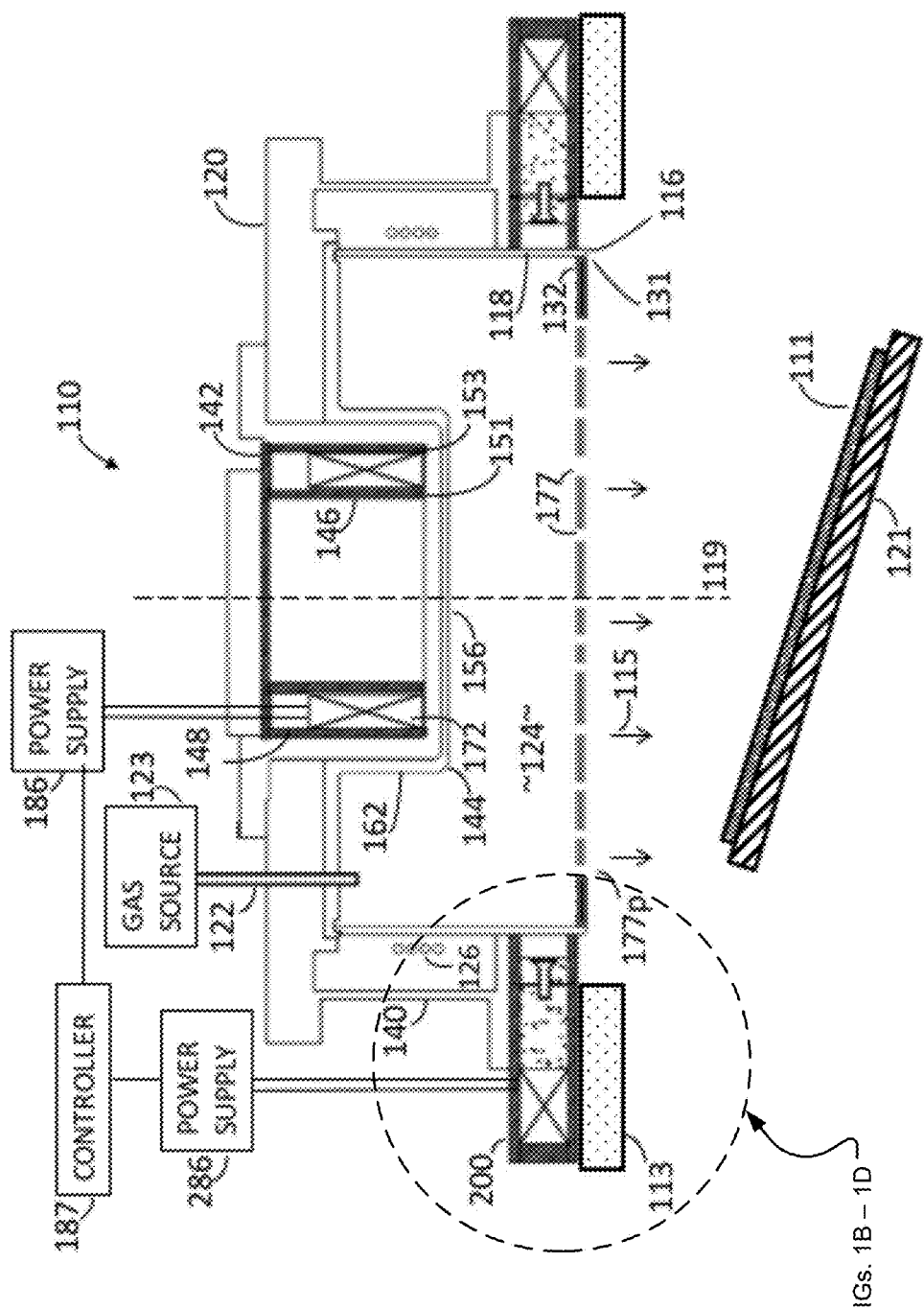
FIG. 1A is a cross-sectional view of a high vacuum processing system incorporating an example dual electromagnet ion source.

FIG. 1A is a cross-sectional view of a high vacuum processing system incorporating an example dual electromagnet ion source 110. In various implementations, the ion source 110 is located in a vacuum processing chamber and generates an ion beam 115 of working gas ions (illustrated herein as arrows), that is directed toward at least one substrate 111. These ions bombard substrate 111 to achieve an intended beneficial result, which may include, for example, removal of material from a top surface of the substrate 111 by an ion beam etching process.

The ion source 110 includes a discharge chamber 116 that is defined by tubular sidewall 118. The tubular sidewall 118 has an opening defined by an open end 131 and a back flange 120 that closes an opposing end of the tubular sidewall 118. The tubular sidewall 118 may be formed, at least partially, from a dielectric material, such as quartz or alumina. High frequency electromagnetic energy, in particular radio frequency ("RF") electromagnetic energy, may penetrate the dielectric material portion of the tubular sidewall 118 with low losses within the material.

The ion source 110 still further includes various high vacuum sealing members (not shown) that provide hermetic seals for vacuum isolation. A gas inlet 122, which extends through the back flange 120, communicates with a discharge space 124 and permits a regulated flow of the working gas from a metered gas source 123 and into the discharge space 124. A sub-atmospheric environment, which may be at a vacuum pressure ranging from about 0.05 mTorr to about 5 mTorr, is maintained in the discharge space 124 by virtue of fluid communication with the evacuated processing chamber.

A coil antenna 126 is wrapped about a portion of the exterior of the discharge chamber 116, with a power supply (not shown) electrically coupled thereto via an impedance matching network (not shown). The power supply may provide power to the coil antenna 126 at a frequency ranging from about 500 kHz to about 15 MHz. An optional Faraday shield (not shown) may be disposed between the coil antenna 126 and the tubular sidewall 118.

High frequency electromagnetic energy, such as RF electromagnetic energy, is transmitted from the coil antenna 126 to the working gas in the discharge space 124 for igniting and sustaining plasma within the discharge chamber 116. More specifically, an electrical current oscillates at a high frequency in the coil antenna 126, which generates a time-dependent magnetic field that is transmitted to the discharge space 124 through the optional Faraday shield and subsequently through the tubular sidewall 118. The time-dependent magnetic field induces an azimuthal electric field inside the discharge space 124 having field lines concentric with the coil antenna 126. The induced azimuthal electrical field accelerates electrons inside the discharge space 124 to travel along circular trajectories. Collisions between the energetic electrons and neutral atoms of the working gas ionize the working gas atoms and generate additional electrons that are also accelerated within the azimuthal electrical field.

A multi-aperture ion optic or grid assembly 132 may be positioned at the open end 131 of the tubular sidewall 118 and is operable to extract working gas ions from the plasma in the discharge space 124 to the ion beam 115 that propagates to the substrate 111. The grid assembly 132 may comprise a plurality of grids spanning the tubular sidewall 118 at the open end 131 of the ion source 110. When appropriately biased, the grids substantially contain the plasma within the discharge space 124 and control the extraction of the ion beam 115 from the discharge space 124. Each grid may be perforated by an array of apertures 177 so that charged particles (electrons and/or ions) may pass through the grid assembly 132 under the extraction conditions. The apertures 177 of the grids may be round and closely aligned with each other. These apertures are located at various radial and azimuthal positions from the ion source central axis 119. Apertures labelled 177*p*, herein referred to as the peripheral grid holes, are located furthest from the central axis 119. They define the extent of the ion extraction region, which is typically is smaller than the overall dimensions of the plasma discharge chamber 116 to avoid "wall effects" on the extracted ion density and trajectories.

The substrate 111 may be supported within the processing space and spaced away from the grid assembly 132 and held on a substrate support 121 that is disposed within the process chamber such that a top surface of the substrate 111 faces the open end 131. The substrate 111 may, in some embodiments, be tilted, offset, and/or otherwise rotated about or relative to its own azimuthal axis.

A cup-shaped re-entrant vessel 144 projects from the back flange 120 and into the discharge space 124 toward grid assembly 132. The re-entrant vessel 144, which may be formed from a conductor, such as aluminum, includes an end wall 156 and a sidewall 162 extending axially from the end wall 156 and toward the back flange 120. The sidewall 162 of the re-entrant vessel 144 may be concentrically and coaxially aligned with the central axis 119 of the discharge chamber 116.

The ion source 110 includes a first electromagnet 142 that is at least partially installed in the re-entrant vessel 144. The first electromagnet 142 includes a magnetic flux concentrator of one or more pieces, illustrated as tubular pole pieces 146, 148 having a geometrical shape that is substantially cylindrical and concentrically arranged about the central axis 119. One or more wire coils 172 are contained within the space between the tubular pole pieces 146,148 of the first electromagnet 142. The wire coils 172 are electrically coupled with power supply 186, which is, in turn, electrically coupled with a controller 187.

A second electromagnet 200 is disposed peripherally outside of the discharge chamber 116 proximate to the open end 131 of the discharge chamber 116, between the open end 131 and the coil antenna 126. The second electromagnet 200 is electrically coupled with a power supply 286, which is, in turn, electrically coupled with the controller 187. A switching device (not shown) may be provided in the power supply 286 to reverse the direction of current flow from clockwise to counterclockwise. The power supply 286 may be a direct current ("DC") power supply or, alternatively, may comprise a pulsed DC power supply or an alternating current ("AC") power supply. The power supply settings are adjusted by the controller 187, which may be manually operated or part of an automated system. In various implementations, the second electromagnet 200 may be referred to herein as the first electromagnet and the first electromagnet 142 may be referred to as the second electromagnet.

The controller 187 coordinates operation of the ion source 110 and, in particular, operation of the electromagnets 142, 200 with respect to an observable effect of the electromagnets 142, 200 on the beam properties or substrate treatment process. The controller 187 may include a programmable logic controller ("PLC"), a digital signal processor ("DSP"), or another microprocessor-based controller with a central processing unit capable of executing software stored in a memory and carrying out the functions described herein, as will be understood by those of ordinary skill. A human machine interface ("HMI") device (not shown) is operatively connected to the controller 187. The HMI device may include output devices, such as alphanumeric displays, a touch screen, and other visual indicators, and input devices and controls, such as an alphanumeric keyboard, a pointing device, keypads, pushbuttons, control knobs, etc., capable of accepting commands or input from the operator and transmitting the entered input to the central processing unit of controller 187. The controller 187 may be provided with standard communications busses compatible with other automated equipment utilized in a production line.

The controller 187 may include one or more algorithms to adjust the current supplied to one or both of the electromagnets 142, 200. In one implementation, the algorithm(s) may determine the amount of electromagnet current adjustment based on the radial effects of the electromagnets 142, 200, acquired performance data as a function of electromagnet current settings, and/or previous current settings to the electromagnets 142, 200. In another implementation, the algorithm(s) are derived from an experimental matrix (e.g., a lookup table). In yet another implementation, the electromagnets 142, 200 are regulated by an artificial intelligence circuit employing fuzzy logic and performance data acquired as a function of the electromagnet current settings. In still another implementation, the controller 187 is directly connected to equipment (e.g., an array of Faraday probes) that measures an etch depth or ion beam current density distribution, which allows the controller 187 to automatically adjust the current in response to detecting an undesirable etch depth or beam current density distribution.

The electromagnets 142, 200 are azimuthally isotropic, to adjust the plasma distribution in the discharge chamber radially. The magnetic flux concentrator and pole pieces of electromagnet 200 are annular rings of inner diameter greater than the outer diameter of the discharge chamber 118. They are fabricated from a single piece of material or assembled from individual sections. In one implementation, shunt pieces and additional pole pieces described below with reference to FIGS. 1B and 1C are also azimuthally isotropic annular rings.

The following discussion provides further detail regarding the magnetic field distribution generated by electromagnets 142 and 200 and their effect on the distribution of the plasma density in the ion source 110, the plasma ion flux from the discharge space 124 to the plane of the ion extraction grids 132, and the ion beam current density. The center electromagnet 142, ignoring any influence from the presence of toroidal electromagnet 200, generates a magnetic field having a magnetic field strength that is approximately proportional to the current supplied to the wire coil 172 times the number of turns of the coil. The magnetic field generated by electromagnet 142, which in the depicted implementation is symmetrical about the azimuthal axis 119, changes the plasma density distribution primarily in the central region of the discharge space 124 and, in turn, alters the ion current density uniformity primarily in the center of the ion beam 115. This magnetic field is not homogeneous, having a maximum field strength in the region between the respective open ends (pole tips) 151, 153 of the pole pieces 146, 148, and diminishing with distance from the open ends 151, 153 such that a minimum field strength is proximate the grids in grid assembly 132 and the coil antenna 126. The magnetic field lines may be concentrated around the azimuthal axis 119, which indicates that the magnetic field strength increases in this region of the discharge space 124. Plasma electrons generated by the rf discharge near the rf coils will, in the absence of externally applied magnetic fields, readily diffuse to the center of the discharge chamber. A magnetic field generated by electromagnet 142 may act on these electrons to redistribute the plasma density distribution in the ion source 110, in particular in the central region of the discharge space 124, and, therefore, the plasma ion flux distribution directed from the plasma to the central region of a grid plane that is defined by the grid assembly 132.

Figure 1B:
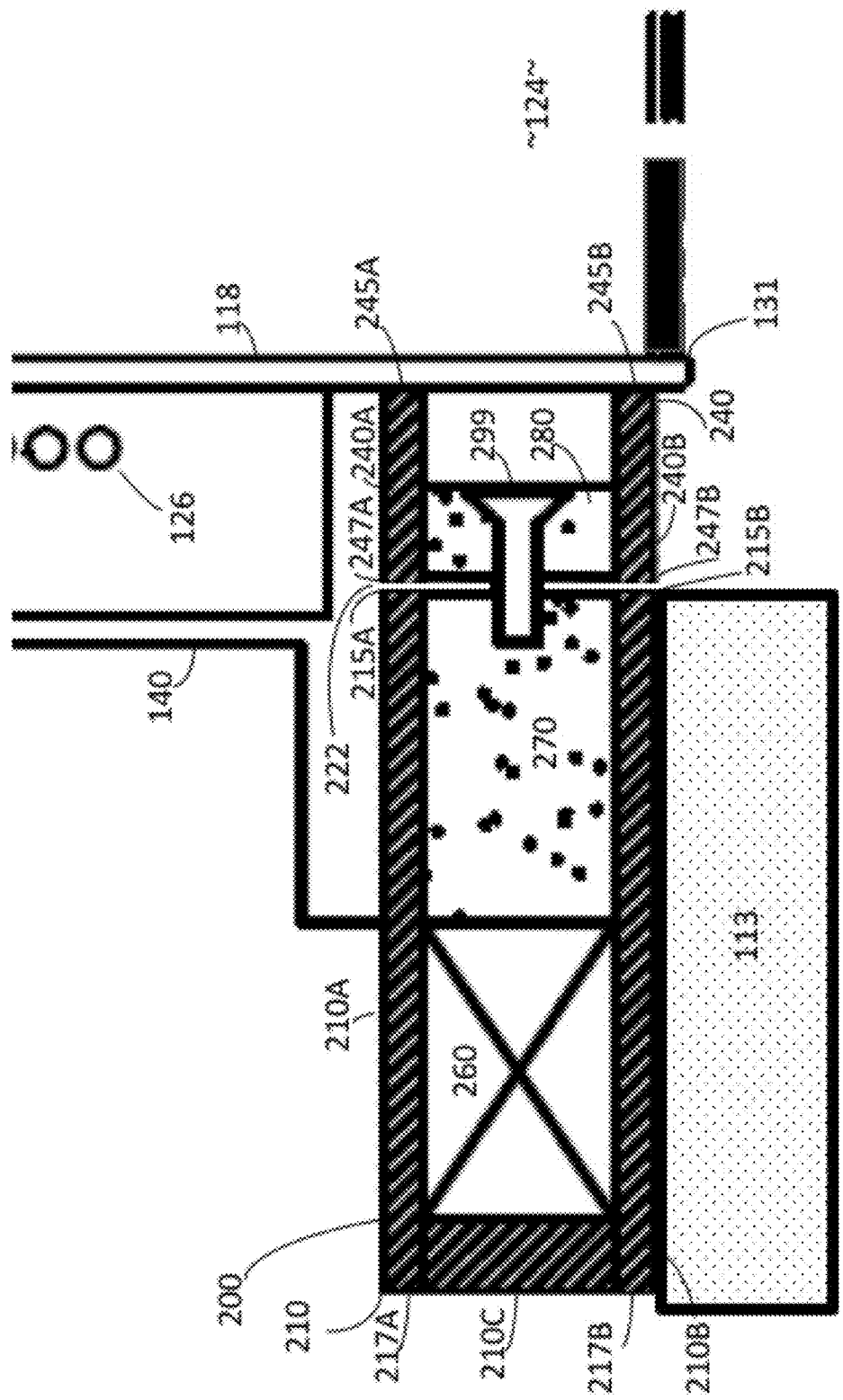
FIG. 1B is an enlarged partial cross-section of the first example toroidal electromagnet disposed at the outer periphery of the ion source of FIG. 1A.
Figure 1C:
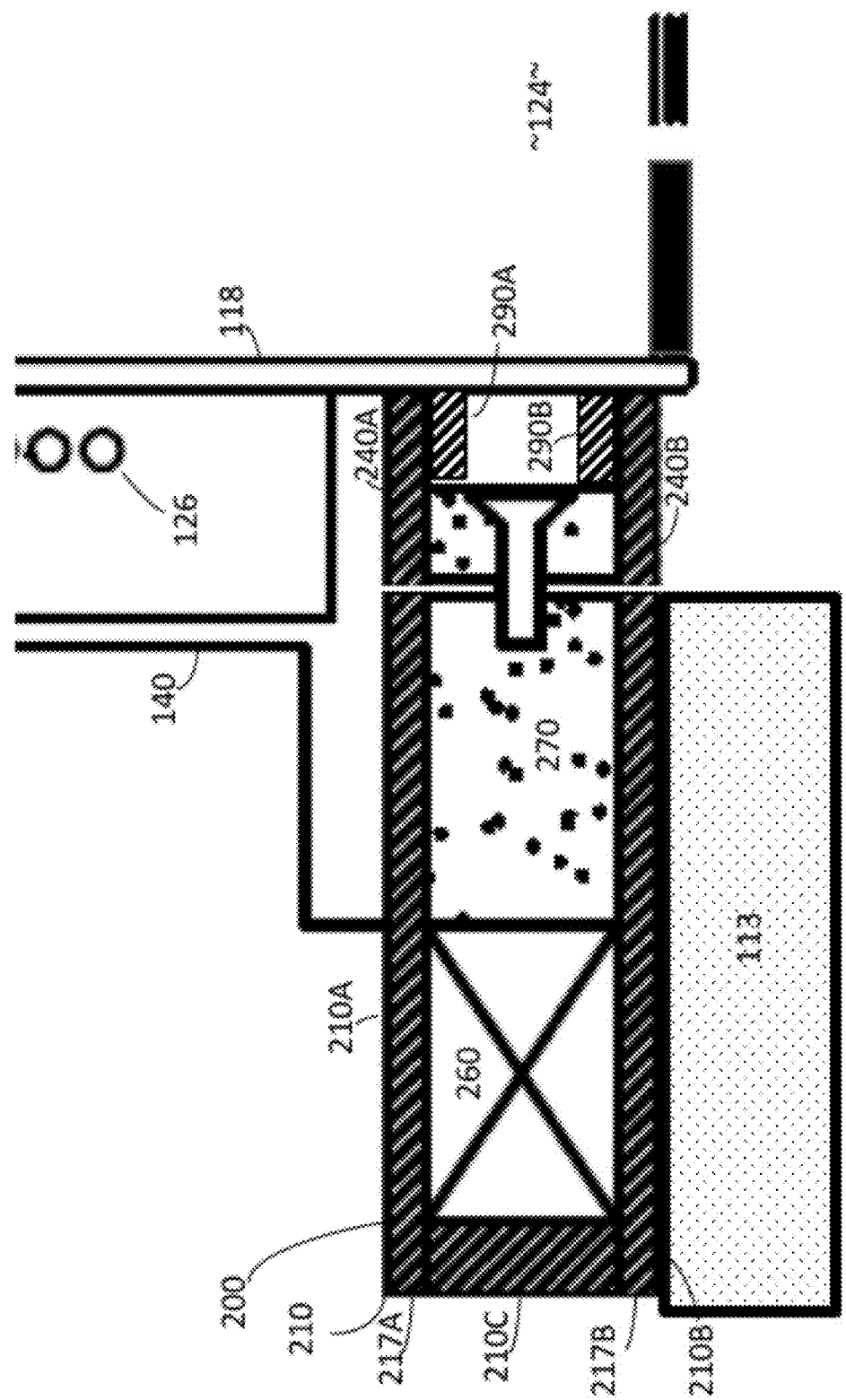
FIG. 1C is an enlarged partial cross-section of a second example toroidal electromagnet having a modified pole piece assembly for further localizing the magnetic field to the periphery of the discharge space of the ion source of FIG. 1A.

FIG. 1B is an enlarged partial cross-section of the first example toroidal electromagnet 200 disposed at the outer periphery of the ion source 110 of FIG. 1A. Illustrated aspects of FIG. 1B not described with specificity below are described above with reference to FIG. 1A. The electromagnet 200 includes at least one wire coil 260, a magnetic flux concentrator assembly 210 and a pole piece assembly 240. The concentrator assembly 210 includes of a pair of spaced apart annular plates (i.e., a top concentrator plate 210A and a bottom concentrator plate 210B) and a magnetic field closure ring 210C. Concentrator plates 210A, 210B are substantially perpendicular to a central axis of the ion source (see e.g., central axis 119 of FIG. 1A). The dimensions of concentrator plates 210A, 210B may be substantially equal. Concentrator plate 210A has an inner end 215A and outer end 217A. Concentrator plate 210B has an inner end 215B and outer end 217B. The outer ends 217A, 217B of concentrator plates 210A, 210B respectively may be mounted to the field closure ring 210C by conventional fasteners (not shown). The spacing between concentrator plates 210A, 210B may be maintained by an annular spacer ring 270 fabricated from a nonmagnetic material, such as aluminum, inserted between the concentrator plates 210A, 210B and affixed to the plates 210A, 210B by conventional fasteners (not shown), for example. Concentrator components 210A, 210B, 210C may be fabricated from a magnetically permeable material, such as low carbon steel, iron, or any other suitable ferromagnetic material, and are electrically grounded.

The wire coil 260 is a continuous winding of an insulated conductor with a suitable solenoidal winding pattern. The number of turns in the wire coil 260 may range from about 300 turns to about 3000 turns, for example. The wire coil 260, which may be wrapped around a spool piece formed from a polymer resin or other nonmagnetic material, is situated within the space between the concentrator plates 210A, 210B.

The magnetic flux concentrator assembly 210 is mounted between flange 140 and annular mounting plate 113, as part of an ion source housing assembly. Vacuum seals, such as O-rings, are provided between a top surface of the concentrator plate 210A and a bottom surface of the flange 140, between a bottom surface of the concentrator plate 210B and a top surface of the mounting plate 113, and between a top and a bottom of spacer ring 270 and the concentrator plates 210A, 210B, respectively.

The electromagnet 200 has a separate pole piece assembly 240 to direct a magnetic flux concentrated in the concentrator plates 210A, 210B to discharge space 124. This allows an associated ion source to be quickly and easily fitted with a different pole piece assembly, which may be desirable for optimizing the magnetic field distribution in the discharge space 124 or quickly reconfiguring the ion source for a different application. In an implementation suitable for generating an azimuthally symmetric magnetic field distribution, the pole piece assembly 240 includes of a pair of spaced apart annular rings (top pole piece ring 240A and bottom pole piece ring 240B), which may be of the same plate thicknesses and platespacing as the magnetic flux concentrator plates 210A, 210B. The pole piece rings 240A, 240B are located radially between the inner radius of the magnetic flux concentrator assembly 210, represented by the ends 215A, 215B of the magnetic flux concentrator plates 210A, 210B and the outer wall of the discharge chamber 118 and are axially aligned with the magnetic flux concentrator assembly 210 such that opposite ends 247A, 247B of pole piece rings 240A, 240B are aligned to the ends 215A, 215B of the concentrator plates 210A, 210B, respectively. Thus the pole piece rings 240A, 240B are radially inward extensions of the annular concentrator plates 210A, 210B, respectively.

The pole piece rings 240A, 240B are mounted on an annular spacer ring 280 analogous to concentrator spacer 270, such that they are spaced apart from each other by substantially the same nominal distance that plates 210A, 210B are spaced from each other. The pole piece rings 240A, 240B may be fabricated from the same magnetically permeable material as the concentrator pieces 210A, 210B, and are electrically grounded. The spacer ring 280 may be fabricated from a nonmagnetic material such as aluminum. The exact dimensions of the outer radii of the pole piece rings 240A, 240B may be defined with reference to the inner radii of the concentrator plates 210A, 210B respectively to allow easy removal of pole piece assembly 240 while minimizing gap 222 between the ends 247A, 247B of the pole piece rings 240A, 240B and ends 215A, 215B of the concentrator plates 210A, 210B, respectively. If the gap 222 is not minimized, it can be a potentially significant source of leakage of the magnetic flux. The gap 222 may be less than 0.25 inch or about 0.0625 inch. The pole piece assembly 240 may be attached to the concentrator assembly 210 by a number of screws (e.g., screw 299) joining the spacer ring 280 to the spacer ring 270 at positions located annularly around the concentrator assembly 240.

Ends 245A, 245B of pole piece rings 240A, 240B, respectively, are located in very close proximity, typically within about 0.1 inch, to the outer surface of the discharge chamber wall 118. The magnetic field generated by the toroidal electromagnet 200 will be concentrated between the ends 245A, 245B (the pole tips) of the pole piece assembly 240, and particularly to the periphery of the discharge space 124 as described in further detail below. Design of the pole piece rings 240A, 240B and the pole tips 245A, 245B may vary from that shown in FIG. 1B to optimize the magnetic field distribution inside the discharge space 124 and/or reduce magnetic interference with ion beam extraction, neutralization, substrate magnetic properties, or other ion beam treatment processes.

In some implementations, the pole piece rings 240A, 240B are fabricated such that they are thicker near the pole tips, which reduces the gap between the pole piece rings 240A, 240B adjacent the chamber wall 118, effectively concentrating the electromagnetic field generated by the electromagnet 200 between the pole tips, and particularly to the periphery of the discharge space 124. In other implementations, the electromagnet 200 includes additional pole piece ring(s) of magnetically permeable material (not shown) external to the pole piece assembly. More specifically, additional pole piece ring(s) are placed axially above and/or below and in close proximity to pole piece assembly of the electromagnet 200 and may be used to further confine the magnetic field from electromagnet 200 to the peripheral region of the discharge space 124. The additional pole piece ring(s) may be affixed to electromagnet 200.

In other implementations, the magnetic field strength of toroidal electromagnet 200 may be locally enhanced in specific azimuthal locations in order to modify the azimuthal plasma density distribution (e.g., to compensate for existing azimuthal plasma non-uniformities, or other downstream sources of azimuthal variation in ion beam processing of a substrate (not shown)).

In one such implementation, the magnetic field strength of electromagnet 200 can be varied azimuthally by azimuthally varying the thickness of pole piece rings 240A, 240B near the ends (pole tips) 245A, 245B closest to the chamber wall 118 and the discharge space 124. In another implementation, a multi-sectional pole piece construction is used in which pole piece assembly 240 is divided into discrete semi-annual sections and the discrete pole piece sections may differ from each other in pole piece or pole tip thickness or shape, magnetic composition, or annular width, including leaving some sectors devoid of such pole pieces.

Yet another implementation for azimuthally varying the magnetic field strength of the electromagnet 200 places multi-sectional additional pole piece(s) external to electromagnet 200, axially above and/or below and in close proximity to pole piece assembly 240. Individual pole pieces in the multi-sectional external pole piece may differ from each other in thickness, shape, magnetic composition or annular width, including leaving some sectors devoid of such pole pieces.

FIG. 1C is an enlarged partial cross-section of a second example toroidal electromagnet 200 having a modified pole piece assembly for further localizing the magnetic field to the periphery of the discharge space of the ion source 110 of FIG. 1A. Illustrated aspects of FIG. 1C not described with specificity below are described above with reference to FIGS. 1A and 1B. The electromagnet 200 includes azimuthally isotropic annular shunt pieces (e.g., shunt rings) 290A, 290B fabricated from magnetically permeable material, such as low carbon steel, iron, or any other suitable ferromagnetic material inserted between pole pieces 240A, 240B. The shunt rings 290A, 290B are attached to surfaces of the pole pieces 240A, 240B facing each other in close proximity to chamber wall 118 and discharge space 124.

In an implementation that locally concentrates the magnetic field in the discharge region between the pole tips of the electromagnet 200, the modified pole piece assembly of FIG. 1C places shunt rings 290A, 290B in between pole pieces 240A, 240B. The shunt rings may be attached to the pole piece rings 240A, 240B.

In another implementation, to azimuthally vary the magnetic field from the electromagnet 200, the thickness of the shunt ring is varied azimuthally. Further, "multi-sectional" shunt pieces rather than azimuthally isotropic annular shunt rings 290A, 290B may be used. The multi-sectional shunt piece(s) include an array of individual shunt sections differing in thickness, shape, or magnetic composition arranged between the pole pieces 240A, 240B of the electromagnet 200 around the periphery of the discharge space 124. For example, a pair of shunt pieces may be selectively placed in certain azimuthal sectors, while leaving other sectors without shunt pieces. The number of different sectors and differences in the shunt pieces between sectors will depend on a desired variation of the magnetic field strength between sectors, which will in turn depend on a desired variation in the azimuthal plasma density or ion beam density distribution.

Figure 1D:
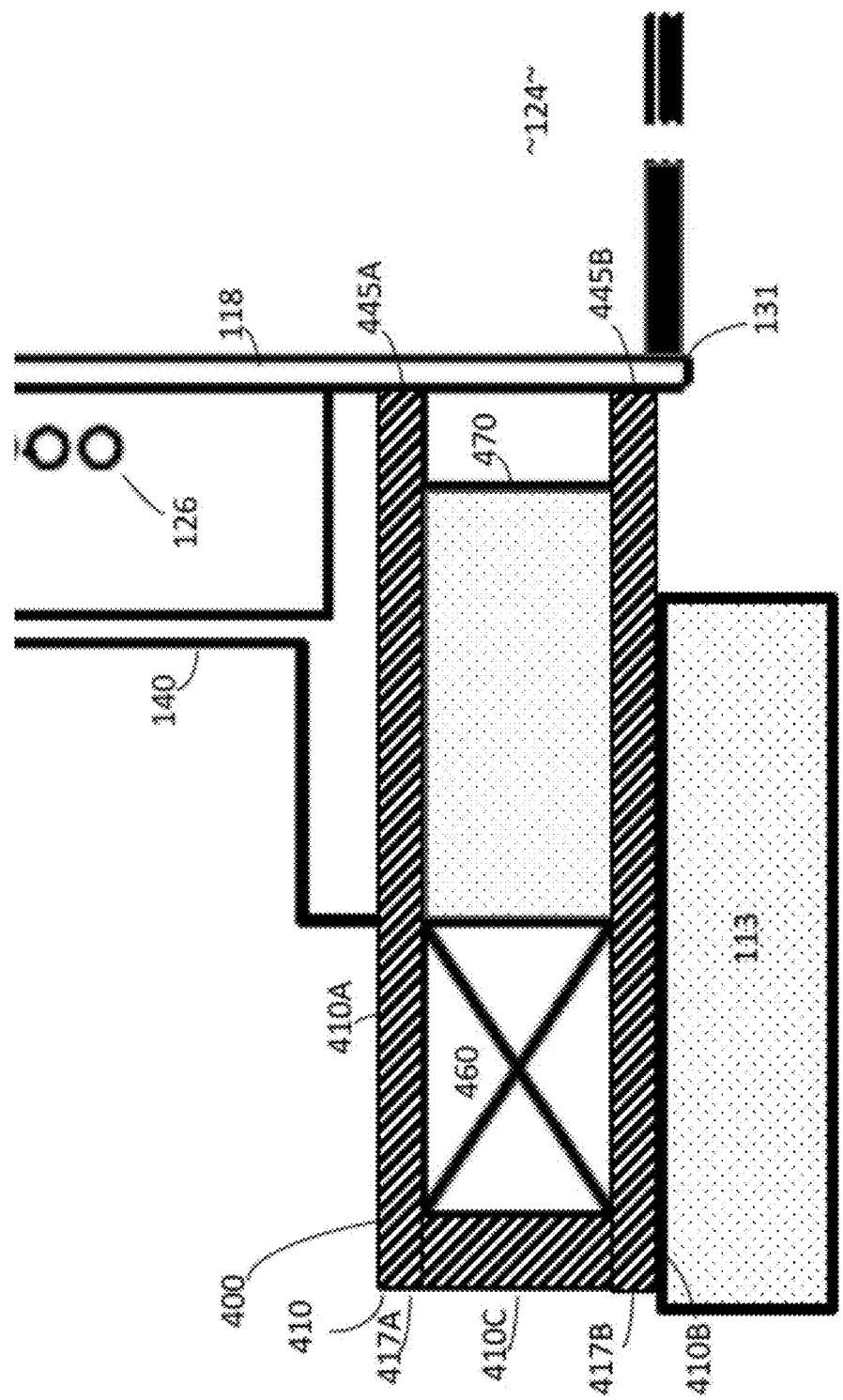
FIG. 1D is an enlarged partial cross-section of a third example toroidal electromagnet, in which the pole pieces are part of an integral magnetic flux concentrator plate assembly.

FIG. 1D is an enlarged partial cross-section of a third example toroidal electromagnet 400, in which the pole pieces are part of an integral magnetic flux concentrator plate assembly. Illustrated aspects of FIG. 1D not described with specificity below are described above with reference to FIGS. 1A and 1B. The electromagnet 400 includes at least one wire coil 460 and a magnetic flux concentrator / pole-piece assembly 410. The assembly 410 includes a pair of spaced apart annular plates (i.e., a top plate 410A and a bottom plate 410B) and a magnetic field closure ring 410C.

The inner radii of the magnetic flux concentrator plates 410A and 410B are adjacent to the plasma discharge sidewall and the faces of these plates are substantially perpendicular to a central axis of the ion source (see e.g., central axis 119 of FIG. 1A). The wire coil 460 is disposed between the magnetic flux concentrator plates 410A, 410B. Concentrator plate 410A has an inner end 445A and outer end 417A. Concentrator plate 410B has an inner end 445B and outer end 417B. Inner ends 445A, 445B are the pole tips. The outer ends 417A, 417B of concentrator plates 410A, 410B respectively may be mounted to the field closure ring 410C by conventional fasteners (not shown). The spacing between concentrator plates 410A, 410B may be maintained by an annular spacer ring 470 fabricated from a nonmagnetic material, such as aluminum, inserted between the concentrator plates 410A, 410B and affixed to the plates 410A, 410B by conventional fasteners (not shown), for example. Concentrator components 410A, 410B, 410C may be fabricated from a magnetically permeable material, such as low carbon steel, iron, or any other suitable ferromagnetic material, and are electrically grounded. The magnetic flux concentrator/pole-piece assembly 410 directs a magnetic flux concentrated in the concentrator plates 410A, 410B through pole tips 445A, 445B to discharge space 124.

Other implementations of the electromagnet 400 that further concentrate the magnetic field inside the discharge chamber include increased thickness of the pole plates 410A, 410B at the pole tips 445A, 445B, use of external pole piece ring(s), and/or use of shunt rings, as described above. Azimuthal variation of the magnetic field distribution of electromagnet 400 can be accomplished by azimuthally varying the thickness of the concentrator plate rings at the pole tips 445A, 445B, use of multi-sectional shunt plates, and/or use of multi-sectional external pole pieces.

FIG. 2A is a partial perspective view of an example multi-sectional electromagnet assembly 300 defining a toroidal electromagnet in which the single electromagnet (e.g., electromagnet 200 of FIGS. 1A-D is replaced with an array of multiple sectional electromagnets (e.g., electromagnets 370a, 370b, 370c) disposed at the outer periphery of an ion source.

Multi-sectional shunt pieces and the alternatives described above with reference to FIGS. 1A-C for azimuthally varying the magnetic field strength of the electromagnets may not be adjustable in real-time. Effecting a change in the azimuthal magnetic field strength distribution may require shutting down the processing system and performing mechanical modifications to the ion source. The alternate "multi-sectional" toroidal electromagnet assembly 300 includes an array of individual electromagnets (e.g., electromagnets 370a, 370b, 370c) that may replace the azimuthally symmetric toroidal electromagnet 200 depicted in FIGS. 1A-C. The use of multiple independently controlled and configured electromagnets mounted at different azimuthal positions around the outside of a discharge chamber permits real-time azimuthally variable changes in the plasma density distribution (e.g., to compensate for existing azimuthal plasma non-uniformities or other downstream sources of azimuthal variation in ion beam processing of a substrate).

The electromagnets 370a, 370b, 370c are enclosed within a concentrator assembly including a top concentrator plate 310A, a bottom concentrator plate 310B, and a magnetic flux closure plate. A water cooling coil 302 may be included to dissipate heat from the electromagnets 370a, 370b, 370c. The multi-sectional electromagnet 300 may be mounted to an ion source assembly as described with reference to FIGS. 1A-C above and may include a separate pole piece assembly (not shown) as described with reference to pole piece assembly 240 of FIGS. 1A-C. A magnetic closure ring of the magnetic flux concentrator assembly and an individual wire coil of the electromagnet 370a are illustrated in FIG. 2B and described in detail below, but omitted in FIG. 2A for clarity.

The number of individual electromagnets in the multi-sectional toroidal electromagnet assembly 300 may vary from as few as two to as many as twenty-four or more, depending on the degree of individual control desired, and the size of the wire coil needed to generate sufficient magnetic field intensity at the rated current. Further, shapes of the magnet wire coils and bobbins may vary from the round shape illustrated in FIG. 2A. In particular, the shape of each bobbin may be curved to match the curvature of the section of the torus on which it is mounted.

In another implementation of the multi-sectional electromagnet 300, the magnetic flux concentrator and pole piece assemblies are also divided into individual segments for each individual electromagnet in order to further azimuthally localize the effects of the individual electromagnets. In yet another implementation of the multi-sectional electromagnet 300, the pole pieces of individual azimuthal electromagnet sections are configured (e.g. shaped or augmented), in different ways in order to modify the azimuthally magnetic field distribution from the electromagnet 300 and thus the influence of the electromagnet 300 on a generated plasma density distribution.

FIG. 2B is a representative cross-section of an example individual electromagnet 370a of the multi-sectional electromagnet assembly 300 of FIG. 2A. The electromagnet 370a includes a dedicated coil 360a arranged annularly around a discharge chamber. The coil 360a may be wrapped on a bobbin 371a having a top plate 375a and a bottom plate 380a. The bobbin 371a is fastened to the annular magnetic flux concentrator bottom plate 310B via screw 385a. The resulting coil assembly is enclosed within a concentrator assembly including a top concentrator plate 310A, a bottom concentrator plate 310B, and a magnetic flux closure plate 310C. A spacer 372 includes a water cooling coil 302 that dissipates heat from the coil 360a. The bobbin 371a, a bobbin top plate 375 and a bobbin bottom plate 380, may be fabricated from a nonmagnetic material, such as aluminum. Plates 310A, 310B, and 310C may be fabricated from a magnetically permeable material, such as low carbon steel, iron, or any other suitable ferromagnetic material.

The coil 360a is coupled by a pair of electrical leads (not shown) to an individual power supply (not shown, see e.g., power supply 286 of FIG. 1A) that allows the current through the coil 360a to be controlled independently from any other coils in the electromagnet. Further, individual leads from multiple coils may be connected to an electrical network which divides the flow of current from one or a select number of power supplies to the individual coils by some controllable mechanism (e.g., variable resistors). The power supply and electrical network (if present) are coupled to a controller (not shown, see e.g., controller 187 of FIG. 1A).

FIG. 3A is a top view of an example toroidal ring cusp field electromagnet 500. Using the electromagnetic assembly 500, a "ring cusp field" magnetic distribution is generated about the periphery of an ion source (not shown) utilizing the assembly 500. Cusp field magnetic distributions around the periphery of a plasma discharge chamber may improve the plasma ionization efficiency by preventing electrons from colliding with the discharge chamber walls, and may also improve the plasma density distribution.

The cusp field toroidal electromagnet 500 may be described as an array of multiple cusp field unit cells (e.g., cells 501, 502, 503). The electromagnet cell 502 differs from the toroidal electromagnet 200 of FIGS. 1A-C primarily in the pole piece structure. An azimuthally symmetric pattern of alternating cut-outs (e.g., cut-out 513A) are made at the inside radii of annular concentrator plate 510A, leaving pole projections (e.g., projection 515A) on top plate 510A, like teeth on a set of gears. Similar alternating cut-outs are made on a bottom plate (not shown) of the electromagnet 500.

Figure 3B:
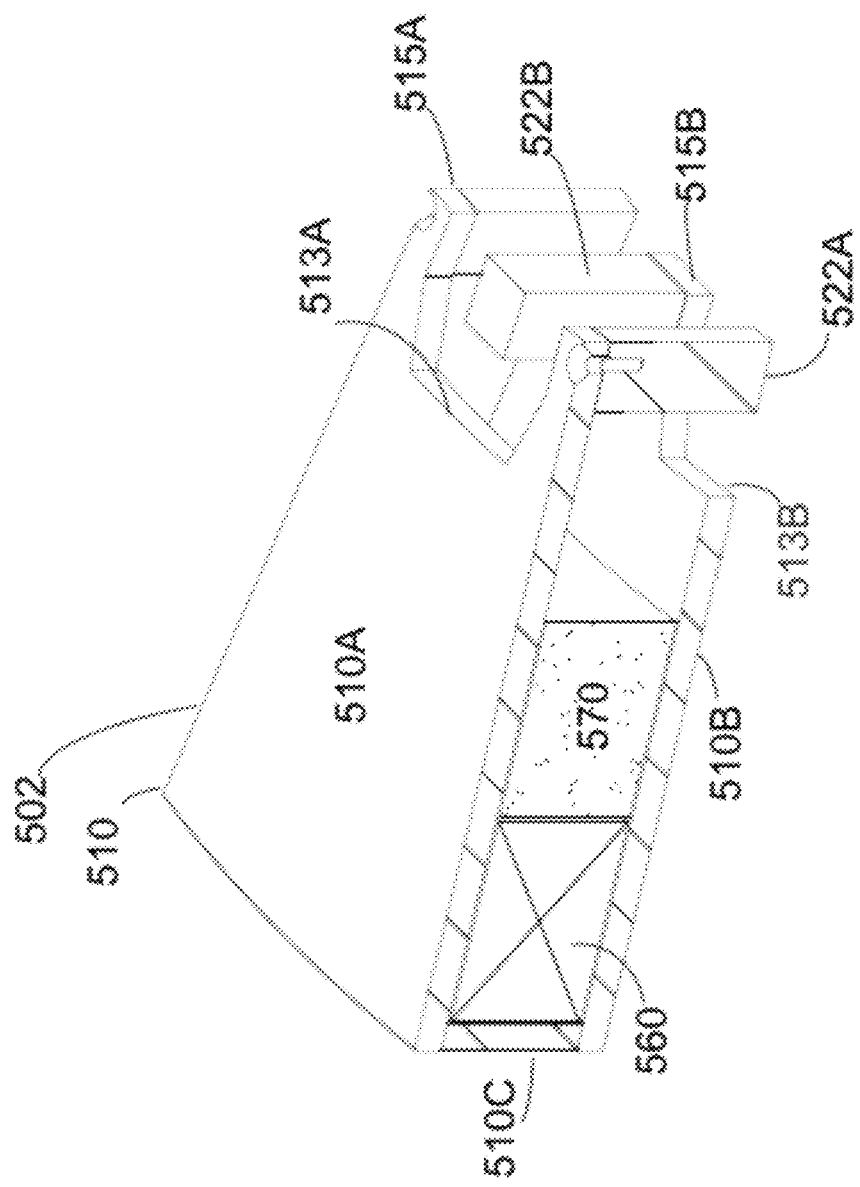
FIG. 3B is a perspective view of an example unit electromagnet cell of the toroidal electromagnet of FIG. 3A, wherein the poles are fabricated in such a way as to produce a ring cusp magnetic field configuration.

FIG. 3B is a perspective view of the example unit electromagnet cell 502 of the toroidal electromagnet of FIG. 3A, wherein the poles are fabricated in such a way as to produce a ring cusp magnetic field configuration. Magnet wire coil 560 corresponds to coil 260 in FIG. 2 and is annularly wrapped around a discharge chamber and housed within a magnetic flux concentrator assembly 510, including a top annular concentrator plate 510A, a bottom annular concentrator plate 510B and a magnetic field closure ring 510C. Spacer 570 may be inserted between the top and bottom concentrator plates 510A and 510B.

Cut-outs 513A and 513B are made at the inside radii of annular concentrator plates 510A, 510B, respectively, leaving pole projection 515A on top plate 510A and pole projection 515B on bottom plate 510, like teeth on a set of gears. Viewed from the top, "teeth" 515A in plate 510A centered over cut-out 513B in plate 510B alternate azimuthally with "teeth" 515B centered underneath cutout 513A of plate 510A. Teeth 515A, 515B have holes drilled through their tips and metal pole pieces 522A, 522B attached to the tips of the teeth 515A, 515B, respectively. The pole pieces are attached such that they are located in the space between concentrator plates 510A, 510B. Viewed from the top, pole piece 522A is mounted underneath teeth 515A and pole piece 522B is mounted on top of teeth 515B. The shapes of the cutouts and the pole pieces may vary from that shown in FIGS. 3A and 3B and may be optimized to generate the cusp magnetic field pattern.

There is no separate pole piece assembly in the cusp magnetic field electromagnet 500 illustrated in FIGS. 3A and 3B. As a result, the magnetic flux concentrator plates 510A, 510B also act as the pole pieces. In other implementations, the concentrator plates 510A, 510B could be simple annular rings (see e.g., plates 210A, 210B of FIG. 1B). A separate pole piece assembly (see e.g., pole piece assembly 240 of FIG. 1B) including top and bottom pole pieces (see e.g., pole pieces 240A, 240B of FIG. 1B) machined with cutouts 513A, 513B and provided with additional pole pieces 522A, 522B could be included with the simple annular ring concentrator plates 510A, 510B.

Other implementations of the pole pieces 146, 148 of the central electromagnet 142 of FIG. 1A may be made to optimize the magnetic field distribution inside the discharge space 124 and/or reduce magnetic interference with ion beam processes from the electromagnet 142, as described for toroidal electromagnet 200 above. In another implementation of the electromagnet 142, the entire pole piece assembly is redesigned to adopt the separate pole piece and concentrator design described with reference to FIG. 1B for electromagnet 200. Similarly, other implementations of the pole pieces 146, 148 of the central electromagnet 142 of FIG. 1A as described with reference to FIGS. 1B-2B may be made to vary the local magnetic field concentration or azimuthal magnetic field distribution in the central region of the ion source 110 of FIG. 1A.

Figure 4B:
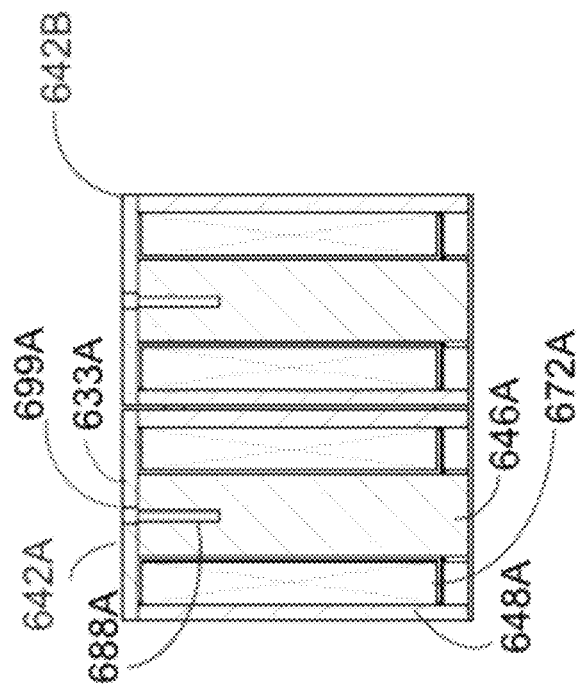
FIG. 4B is a side sectional view of the example central electromagnetic assembly of FIG. 4A.
Figure 4A:
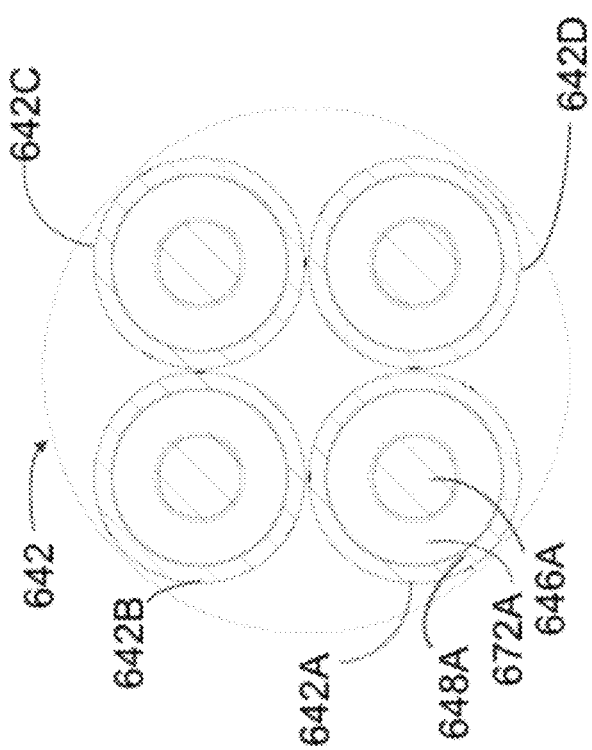
FIG. 4A is a top sectional view of an example central electromagnetic assembly including multiple individual electromagnets with pole pieces.

FIG. 4A is a top sectional view of an example central electromagnetic assembly 642 including multiple individual electromagnets 642A, 642B, 642C, 642D with associated pole pieces (e.g., pole piece 648A). In various implementations, the electromagnetic assembly 642 may take the place of the electromagnet 142 of FIG. 1A. The electromagnets 642A, 642B, 642C, 642D are integrated within a closed end of an ion source discharge chamber, each electromagnet including a magnetic flux concentrator and a coil, the magnetic flux concentrator including an outer tubular sidewall and each coil being arranged within the outer sidewall. Individually controlling the electromagnets 642A, 642B, 642C, 642D permits azimuthally varying the plasma density distribution in the center of the discharge chamber to compensate for existing plasma non-uniformities or azimuthal variation in the downstream ion beam substrate processing results.

FIG. 4B is a side sectional view of the example central electromagnetic assembly 642 of FIG. 4A. More specifically, FIG. 4B illustrates electromagnets 642A, 642B, 642C, 642D oriented vertically. Electromagnet 642A is discussed below as representative of the construction of all the electromagnets 642A, 642B, 642C, 642D. A magnetic flux concentrator/pole piece assembly includes a cylindrical magnetic core piece 646A surrounded by a tubular magnetic pole piece 648A. Magnetic flux closure plate 633A prevents magnetic field losses through a backside of the ion source. Magnet wire coil 672A is wrapped around core piece 646A (e.g., the on a spool piece). The electromagnet 642A and the combined assembly 642 are fastened together, for example via threaded hole 688A, through hole 699A, and a corresponding threaded fastener (not shown). Although this depicted implementation shows four central electromagnets, greater or fewer electromagnets may be used, depending on the degree of individual control needed, and the size of the wire coil needed to generate sufficient magnetic field intensity at the rated current, for example. Further, shapes of the electromagnets 642A, 642B, 642C, 642D may vary, for example the electromagnets 642A, 642B, 642C, 642D may have a rectangular or hexagonal cross-section.

The wire coil of each of the electromagnets 642A, 642B, 642C, 642D may be coupled to an individual power supply (not shown, see e.g., power supply 186 of FIG. 1A) by a pair of electrical leads (not shown) that allows the current through each coil to be independently controlled. In another implementation, individual leads from several coils may be connected to an electrical network which divides the flow of current from one or a select number of power supplies to the individual coils by a particular mechanism, such as a set of variable resistors. The power supply and electrical network (if present) are coupled to a controller (not shown, see e.g., controller 187 of FIG. 1A).

FIG. 5 illustrates a cross-sectional map of example magnetic field contour maps for a central electromagnet 142 and a toroidal electromagnet 200 of an example ion source 110. The ion source 110 of FIG. 5 has features similar to the ion source 110 of FIG. 1, and the descriptions of features of the ion source 110 of FIG. 1 may apply similarly to features of the ion source 110 of FIG. 5. For clarity of illustration, boundaries of the plasma discharge region, including discharge chamber wall 118 and re-entrant vessel wall 162 are shown on the left side of FIG. 5 only.

Rf coil 126 is represented as a single turn ribbon and discharge chamber 124 is illustrated as semitransparent, so that the portions of the rf coil 126 and the toroidal electromagnet 200 behind the discharge chamber 124 are visible. Further, the electromagnet 200 is depicted without a separate pole piece assembly as described in detail with reference to FIGS. 1B and 1C, again for clarity of illustration. Electromagnet 142 may generate magnetic field contour lines 810 in the central area of the ion source 110, and electromagnet 200 may generate magnetic field contour lines 820 in the peripheral area of the ion source 110. FIG. 5 illustrates an implementation where current supplied to the center electromagnet 142 may be adjusted to modify the plasma density distribution in the center of the discharge region and optimize the ion current density distribution at the center of a substrate being processed. Current supplied to the toroidal electromagnet 200 may be independently adjusted to modify the plasma density distribution at the periphery of the discharge region and thus an ion current density distribution near the periphery of the substrate. Ion source 110 may thus allow controlled processing of larger substrates than another ion source with either electromagnet alone.

FIG. 5 omits weaker magnetic field lines from the toroidal electromagnet 200 and the central electromagnet 142. Depending on the relative field strength and vector directions of these weaker outer fields, the effects of each of the electromagnets 200, 142 on the plasma distribution in the discharge may be relatively independent. In other implementations, if either or both electromagnets 200, 142 are sufficiently energized, overlap of the two magnetic field distributions can introduce significant interactive effects on the plasma density distribution, which will depend on the relative polarities of the electromagnets 200, 142. Operation of the ion source 110 under these overlapping magnetic field conditions is described in further detail below with reference to FIGS. 11A and 11B.

Figure 6:
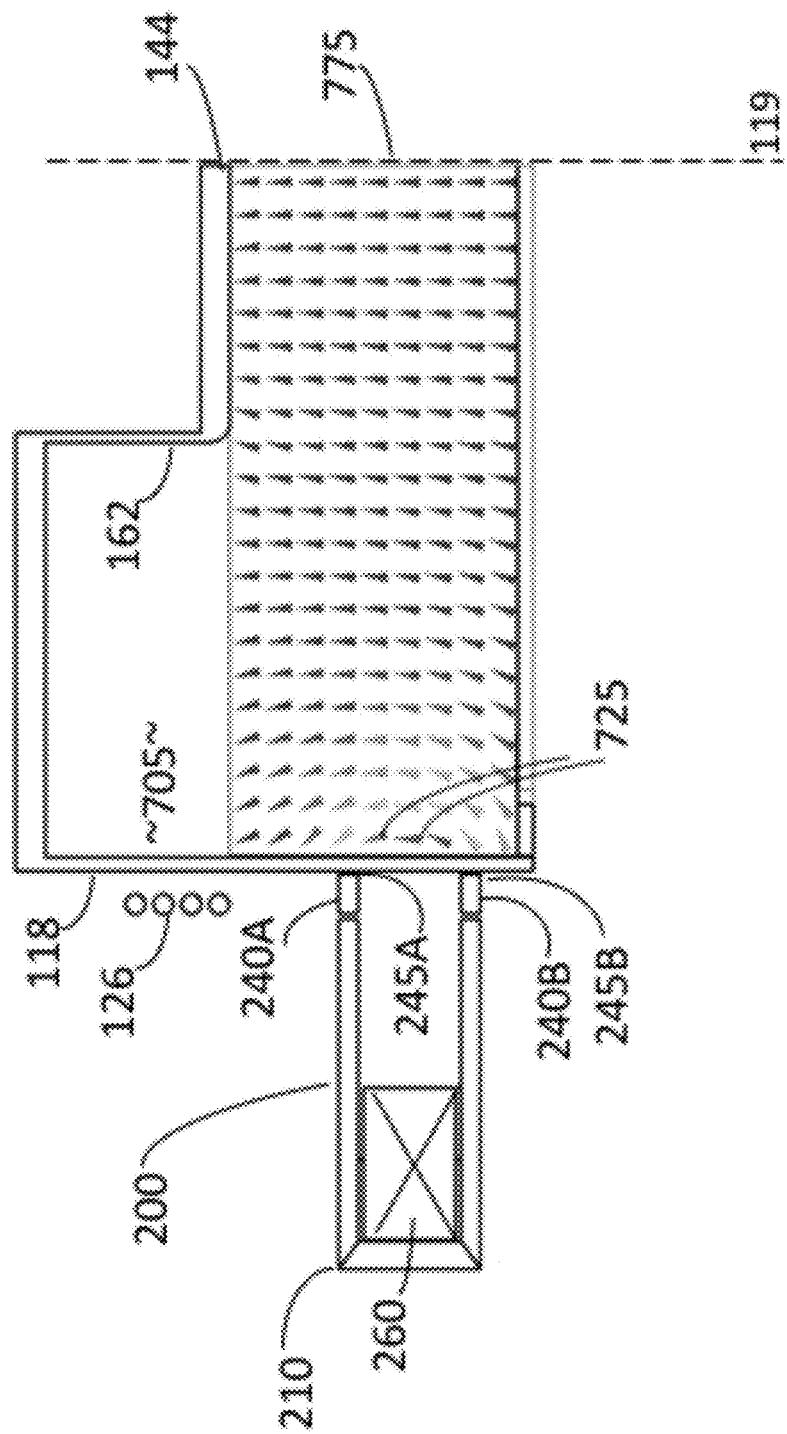
FIG. 6 illustrates an example magnetic vector field distribution generated by the toroidal electromagnet of FIG. 1B.

FIG. 6 illustrates an example magnetic vector field distribution (illustrated by vector field map 775) generated by the toroidal electromagnet 200 of FIG. 1B. FIG. 6 is further a representative partial cross-section of the axially symmetric ion source 110 of FIG. 1A. More specifically, the toroidal electromagnet 200, together with rf coil 126, may generate the magnetic field distribution shown by the vector field map 775, in the absence of any significant influence from the electromagnet 142 of FIG. 1A. Near the electromagnet 200, the magnetic field strength is approximately proportional to the current supplied to the wire coil 260 multiplied by the number of turns of the coil. The magnetic field generated by the electromagnet 200, which in this implementation is azimuthally symmetrical about azimuthal axis 119, influences plasma density distribution in the ion source 110, in particular in the peripheral region of the discharge space. This magnetic field is not homogeneous, having maximum field strength in the region between respective open ends 245A, 245B of pole pieces 240A, 240B respectively, and diminishing with distance from the open ends 245A, 245B. The strongest magnetic field lines, such as those along the vector path marked 725, are concentrated near walls of the discharge chamber 118 and are mainly parallel to the ion source axis 119. A magnetic field generated by the electromagnet 200 may act on plasma electrons as a magnetic mirror to inhibit electron diffusion to the walls of the ion source. This may directly influence the plasma density distribution in the ion source 110, particularly in the peripheral region of the discharge chamber, and, therefore, the plasma ion flux distribution directed from the plasma to the peripheral region of an ion extraction plane that is defined by grid assembly 132 of FIG. 1A.

In the implementation of FIG. 6, the electrical current flow through coil 260 in this is counterclockwise. If this current flow were reversed, the direction of the magnetic field vectors would be reversed. However, this may not impact the electron trajectories or the plasma density distribution in the absence of other significant sources of magnetic field.

Figures 7A, 7B:
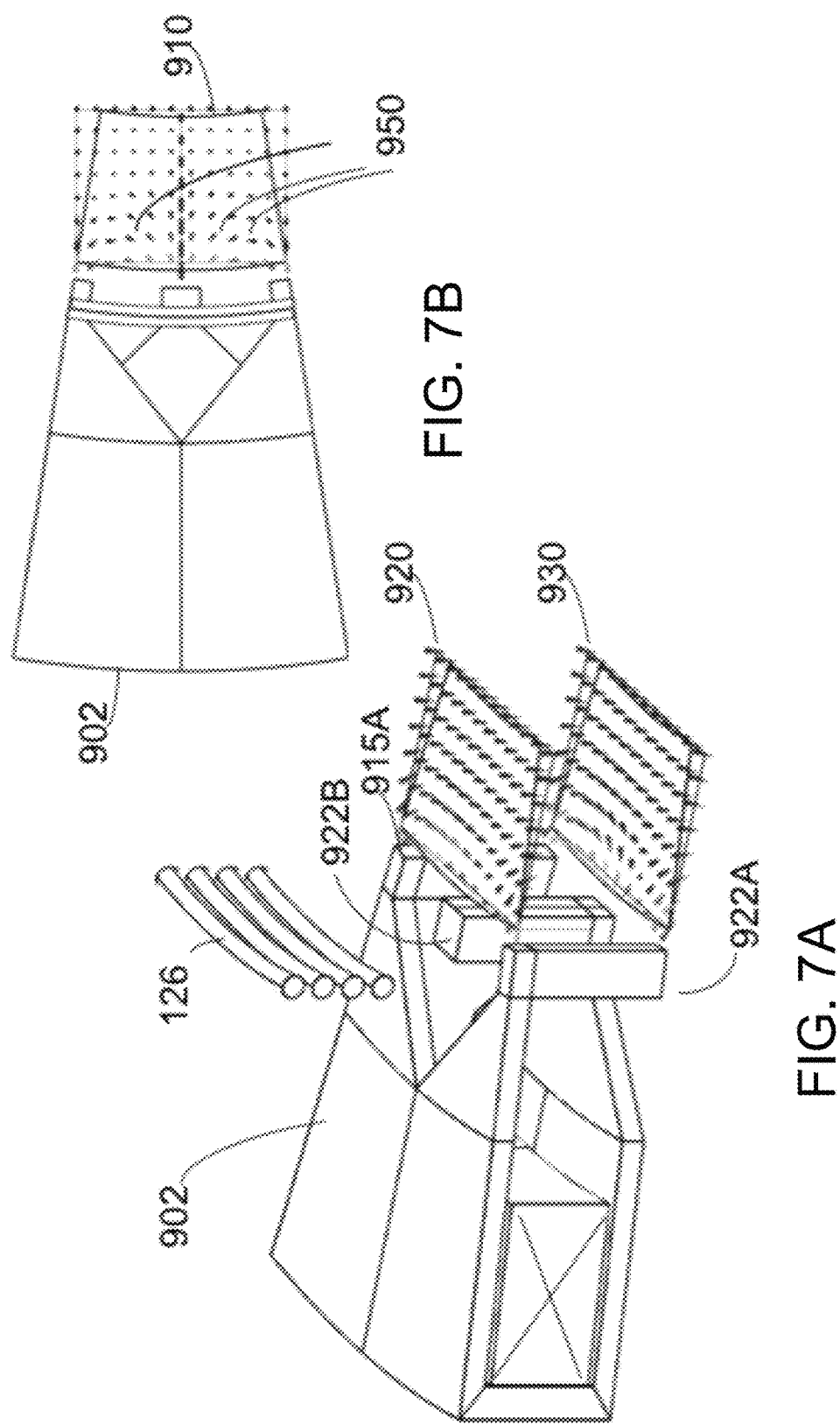
FIG. 7A illustrates a perspective view of modeled example magnetic vector field distribution maps in the planes at a top and a bottom of the cusp magnetic field toroidal electromagnet of FIGS. 3A and 3B.
FIG. 7B illustrates a cross-sectional plan view of a modeled example magnetic vector field distribution map of the cusp magnetic field toroidal electromagnet of FIGS. 3A and 3B.

FIG. 7A illustrates a perspective view of modeled example magnetic vector field distribution maps 920, 930 in the planes at a top and a bottom of the cusp magnetic field toroidal electromagnet of FIGS. 3A and 3B. The distribution maps 920, 930 are generated by a unit cell 902 and rf coil 126, which may be similar in construction to that shown in FIGS. 3A and 3B. In close proximity to magnet poles 922A and 922B, where the magnetic field is strongest, such as along representative field vectors 950, magnetic fields are directed along curved paths ("cusps") from the two outer "top" poles 922A to the inner "bottom" pole 922B. Each of the unit cells by symmetry may have the same magnetic field distribution. The net result is concentration of the magnetic field in an azimuthal ring of cusps adjacent to the discharge chamber wall 118 in a horizontal plane.

FIG. 7B illustrates a cross-sectional plan view of a modeled example magnetic vector field distribution map 910 of the cusp magnetic field toroidal electromagnet of FIGS. 3A and 3B. The vector magnetic field map 910 lies in a horizontal plane cutting through the center of the magnetic pole pieces 922A, 922B of FIG. 7A, as seen from a top view of the unit cell 902.

Figure 8:
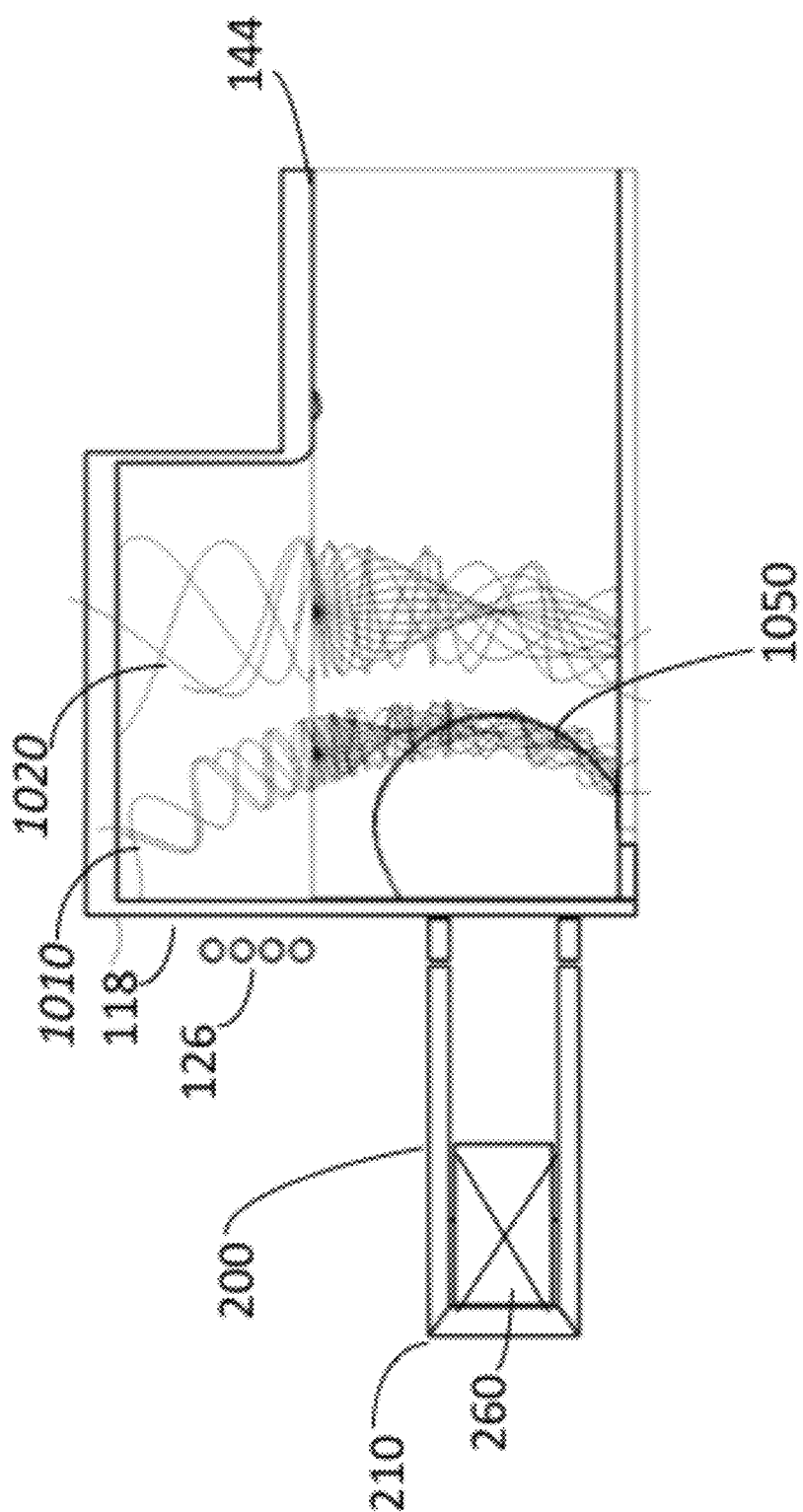
FIG. 8 illustrates two modeled examples of magnetized electron trajectories in a plasma subject to a magnetic field generated by the toroidal electromagnet of FIG. 1B and a critical magnetic field contour line that illustrate a criterion for effectiveness of the electromagnet influence on plasma density distribution in an ion source.

FIG. 8 illustrates two modeled examples of magnetized electron trajectories in a plasma subject to a magnetic field generated by the toroidal electromagnet 200 of FIG. 1B and a critical magnetic field contour line that illustrate a criterion for effectiveness of the electromagnet influence on plasma density distribution in an ion source. An electron moving in a magnetic field "B" experiences a force which causes it to orbit about the magnetic field direction with the gyromagnetic (gyro) radius $r_g$ is proportional to $E^{1/2}/eB$, where B is the magnitude of the magnetic field, and E is the energy of the electrons transverse to the magnetic field. Electron motion parallel to the magnetic field is unaffected by the field. The net result (ignoring collisions, which are infrequent for these path lengths for the typical low pressure ion source operation) is that the electron tends to spiral in the direction of the magnetic field lines at the gyro radius. Such electrons are said to be "magnetized." Thus strong electron confinement (small gyro radius) will result if the magnetic field strength is relatively high, or the electron energy is relatively low. Due to minimization of electrostatic forces in the plasma, plasma diffusion will follow the path of the electrons.

The above-described electron magnetization effect is illustrated for two different sets of electron trajectories 1010 and 1020 for the particular magnetic field distribution generated by the toroidal electromagnet 200 (and rf coil 126) of FIG. 6, assuming an electron energy of 10 eV, representative of a typical rf low pressure plasma. Each set of electron trajectories results from injecting a number of electrons with various initial trajectories at a particular point in the primary plasma generation area of the plasma discharge 705 near the rf coil. Despite different initial directions, these electrons tend to converge and spiral around a common center of motion along local magnetic field lines.

A criterion for determining the minimum magnetic field strength needed to have an impact on the plasma density distribution in the discharge chamber is the size of the electron gyro radius compared to the overall chamber dimension "D" (e.g., the diameter of discharge chamber 116 of FIG. 1A). In some implementations, the critical maximum gyro-radius is about one tenth of the diameter D. For the 10 eV electron energy and magnetic field map of this example, the average gyro-radius of the electron trajectory set 1010 corresponds to this critical gyro-radius. The shown magnetic field contour line 1050 represents a corresponding critical magnetic field strength. Since the magnetic field strength increases in the direction of the discharge chamber wall 118 proximate to the pole pieces of electromagnet 200, the region wherein the magnetic field strength is sufficient to impact the plasma density is bounded by this wall 118 and magnetic field line 1050. For regions within a critical radius defined by magnetic field line 1050, the gyro radius is greater than the critical gyro-radius, and the impact of the magnetic field on the electrons in the plasma may be too disperse to be of any practical use. This is illustrated for example by the electron trajectory set 1020.

Figure 9A:
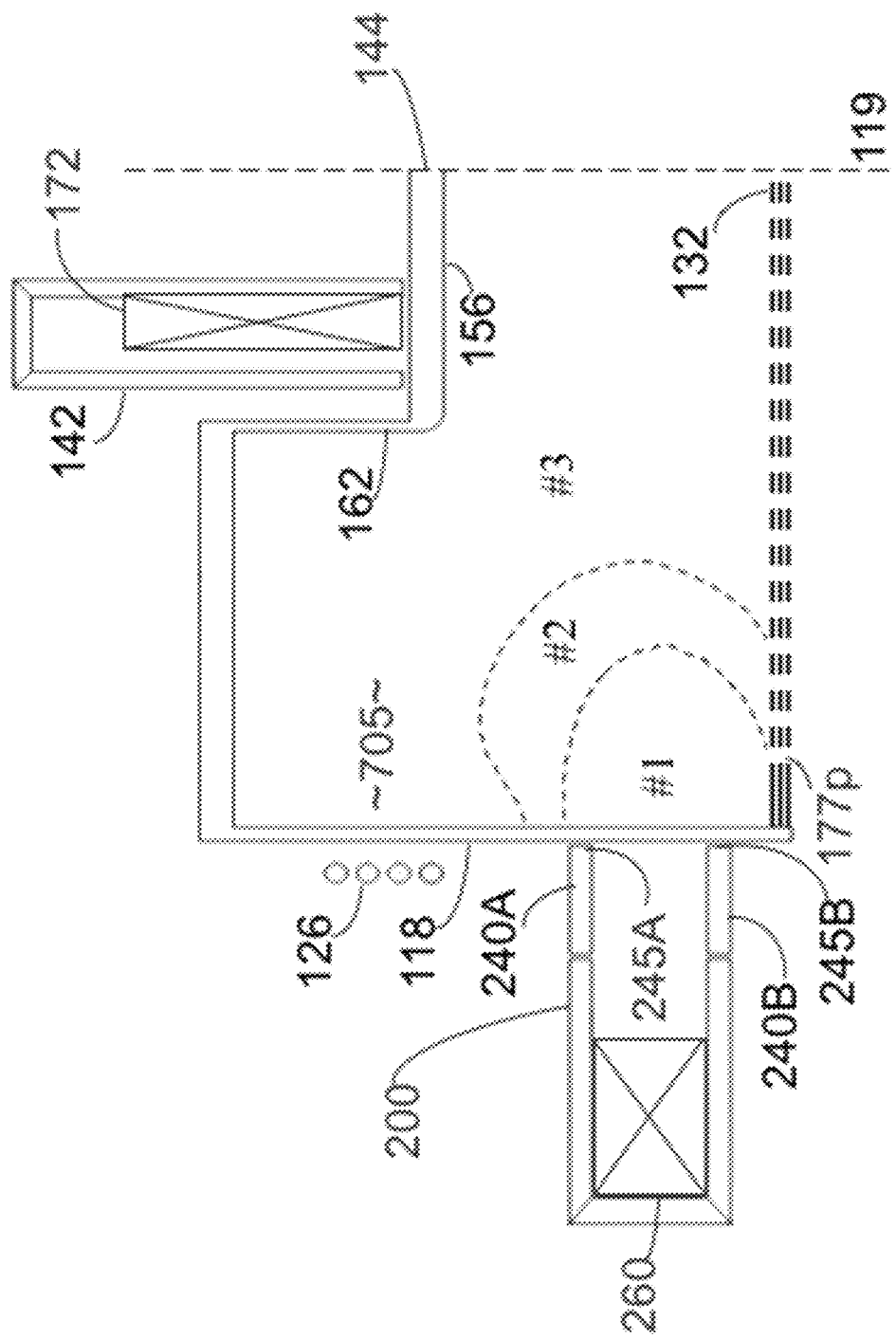
FIG. 9A illustrates three different regions in a plasma discharge space of an ion source within which the effect of the generated magnetic field from the toroidal electromagnet of FIG. 1B influences the plasma density distribution.

FIG. 9A illustrates three different regions in a plasma discharge space of an ion source within which the effect of the generated magnetic field from the toroidal electromagnet of FIG. 1B influences the plasma density distribution. FIG. 9A further illustrates a similar partial cross-sectional view to that of ion source 110 of FIG. 8. More specifically, plasma generated in primary ionization region 705 diffuses to discharge space 124 from which the ion beam current is extracted by the ion optics of grid assembly 132, or to surfaces such as discharge chamber wall 118 or re-entrant vessel walls 162, 156 at which the plasma may be extinguished.

For simplicity of the following discussion, changes in the profile of the plasma density distribution within the discharge chamber or the ion beam current density distribution at the substrate may be described as making the profile more "concave" or more "convex." Changes in the shape of the plasma profile will tend to result in like changes in the ion beam current density distribution at the substrate, although not necessarily to the same degree. A profile is "concave" if the value of the plasma density or the ion beam current density at the periphery is higher than the value at the center of the profile. In the reverse case (i.e., value in center greater than at the periphery) the profile is "convex." The area of particular interest regarding the plasma density profile is that over which the ion beam is extracted from the plasma, i.e. the patterned area of the ion optics of grid assembly 132; thus the "periphery" refers to the location of the peripheral grid apertures 177p. For the ion beam current density distribution the "periphery" refers to the outer radius of the substrate to be processed.

The effect of the magnetic field of the toroidal electromagnet 200 on rf power consumption and plasma density distribution of ion source 110 as a function of the magnetic field strength may be described in terms of three distinct regions of magnetic field influence on the plasma density distribution, indicated by regions #1, #2, and #3 in FIG. 9A. Each region includes a portion of the discharge space between the ion source axis 119 and the discharge chamber wall surface 118, particularly the region 118a adjacent to the magnetic pole ends 245a, 245b of electromagnet 200. Region #1 is the region closest to the wall surface 118a and is bounded by an envelope represented by the dashed line labeled 1101 of FIG. 9A; Region #2 surrounds Region #1 and is bounded by the envelope represented by the dashed line labeled 1102 of FIG. 9A; and Region #3 is between Region #2 and the ion source axis 119. Envelopes 1101 and 1102 each represent, for different overall magnetic field strengths (i.e., magnet coil 260 currents) the critical magnetic field strength contour line, corresponding to line 1050 in FIG. 8, within which plasma electrons are sufficiently magnetized to orbit within the critical gyro radius and locally influence the plasma distribution. Region #1 corresponds to a low range of overall magnetic field strength (i.e., a low range of electromagnet currents in the magnet coil 260), R1; Region #2 to a moderate overall magnetic field strength and magnet current range R2; and Region #3 to a high overall magnetic field strength and magnet current range R3.

Figure 9B:
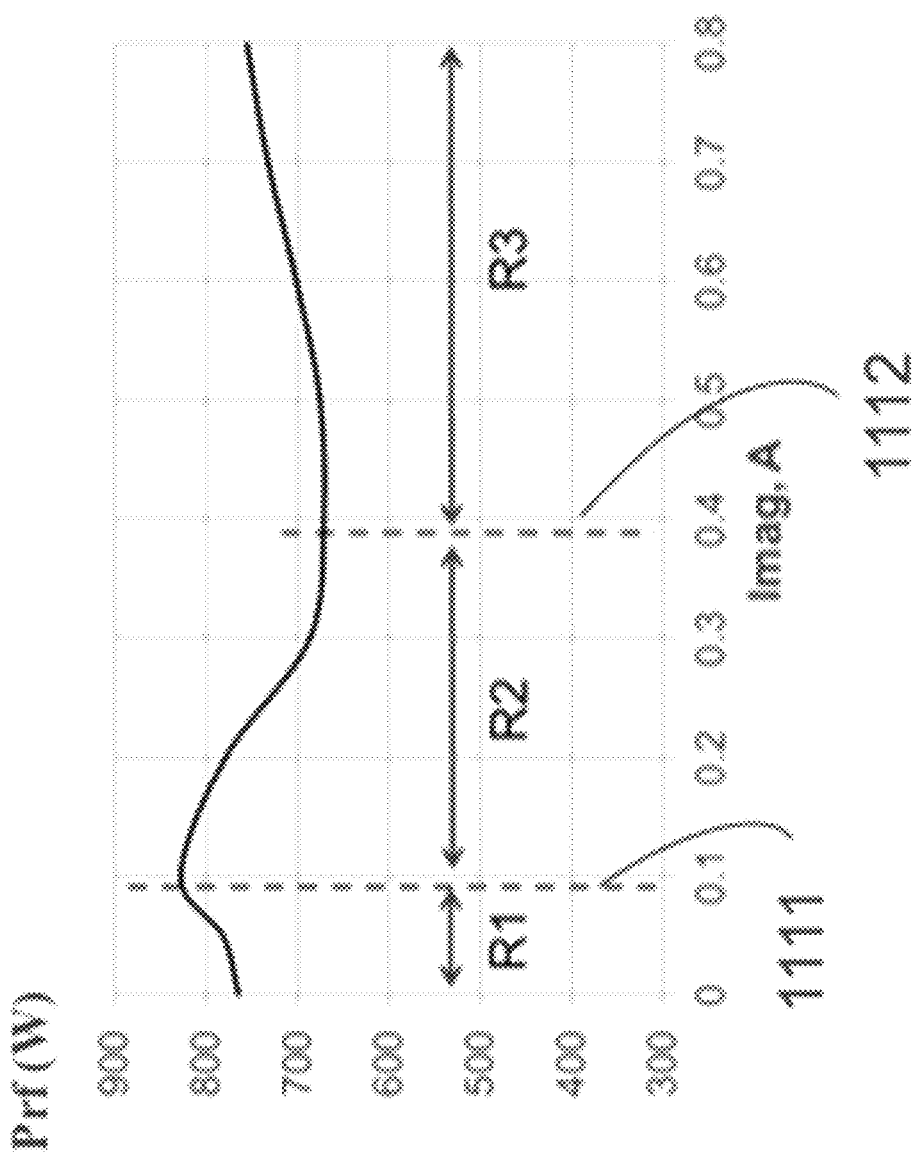
FIG. 9B illustrates the effect of the electromagnetic field generated by the toroidal electromagnet of FIG. 1B on rf power consumption of an ion source.

FIG. 9B illustrates the effect of the electromagnetic field generated by the toroidal electromagnet of FIG. 1B on rf power consumption of an ion source. Magnet current ranges R1, R2, and R3 are graphically depicted in FIG. 9B, discussed in detail below.

When the magnet current is in range R1, the effective magnetized electron trajectories terminate on the wall 118 and on the outer periphery of the ion optic grid assembly 132, outside of the boundary of the ion extraction defined by peripheral grid apertures 177*p*. Thus plasma losses and therefore consumed rf power may increase as the magnetic field strength is initially raised. Also, reduction in the plasma density at the periphery may reduce the ion current density at the periphery of the substrate, making the ion beam current density profile more convex.

When the magnet current is in range R2, electrons can be strongly magnetized out to the edge of envelope 1102, such that the plasma generated in region 705, instead of diffusing to the wall 118 may be driven away and guided to the ion extraction region, inside the peripheral grid apertures 177*p*. This may reduce plasma losses at the walls, and thus decrease rf power consumption as the magnetic field strength of electromagnet 200 is increased. It also may increase the plasma density near peripheral grid apertures 177*p*, which in turn may increase the ion current density at the periphery of the substrate, making the ion current density profile more concave.

When the magnet current is in range R3, electron magnetization by the peripheral electromagnetic 200 is effective deep into the center of the discharge; as the magnetic field strength is increased in this range, the re-entrant plug 144 may increasingly become a bottleneck for the plasma flow, resulting in plasma losses on walls 162 and 156, and causing rf power to increase again. Since plasma diffusion to the central region of the ion source is inhibited, the ion current density profile may become even more concave.

Figure 9C:
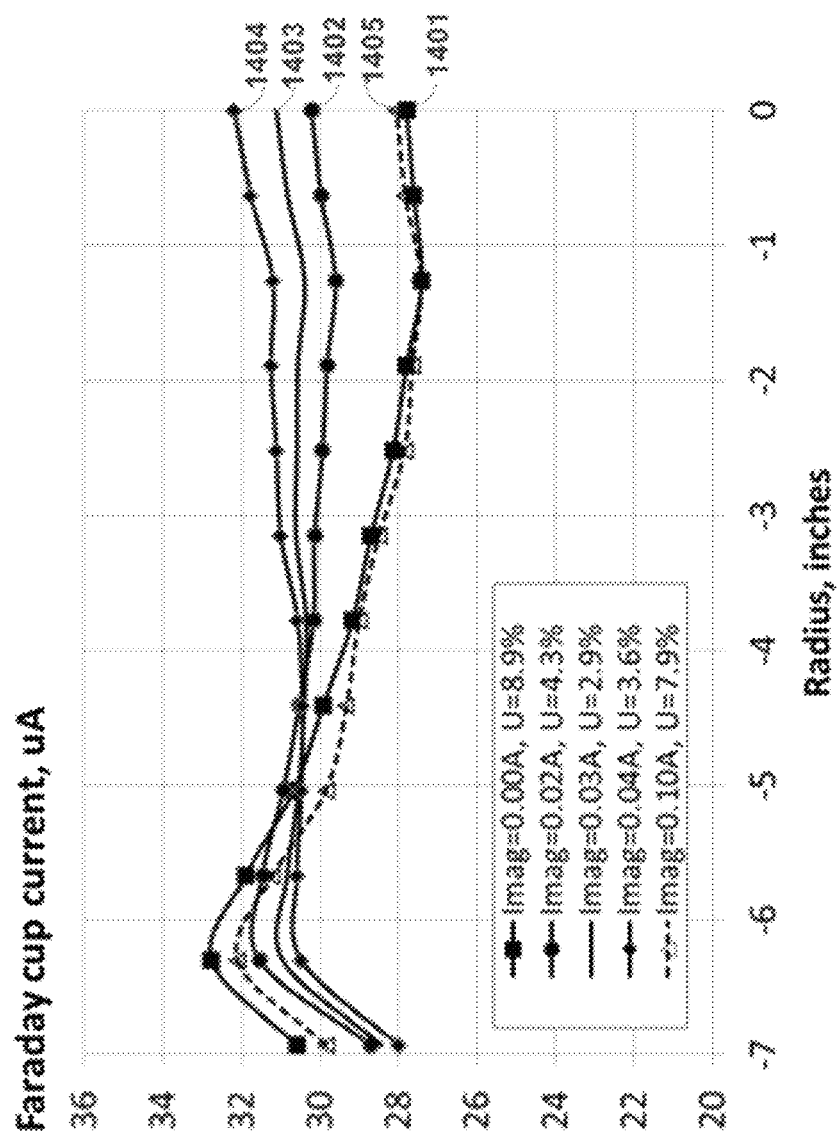
FIG. 9C illustrates the effect of the electromagnetic field generated by the toroidal electromagnet of FIG. 1B on ion beam current density distribution when the electromagnet is operated in a low to moderate magnetic field strength range.

FIG. 9C illustrates the effect of the electromagnetic field generated by the toroidal electromagnet of FIG. 1B on ion beam current density distribution when the electromagnet is operated in a low to moderate magnetic field strength range.

Example results of the toroidal electromagnet 200 operation are described with reference to FIGS. 9B and 9C. The ion source illustrated in FIG. 1B and FIG. 6 was operated with central electromagnet 142 turned off and toroidal electromagnet 200 energized with a counterclockwise electrical current flow through the magnet coil 260.

FIG. 9B graphically depicts the results of increasing the magnetic field strength, by increasing the electromagnet coil current "Imag", on the ion source rf power consumption "Prf" for an argon ion beam of 400V and 445 mA. "Prf" is the power supplied to rf coil assembly 126, measured at rf power supply 286, required to achieve the 445 mA ion beam current.

As described above, dependence of the rf power consumption on the magnet current may be described in terms of three distinct magnet current ranges R1, R2, and R3. In the low magnet current range R1, an increase in rf power (about 50 W) is observed as the magnet current is raised from zero to a first transition point at Imag about 0.2 A, marked by line 1111. The magnet current at the transition point 1111 corresponds to the critical magnetic field defined by envelope 1101 in FIG. 9A. As detailed in the discussion of FIGS. 9A, 9B, rf power losses in range R1 may be due to plasma concentration in Region #1 too near the discharge chamber periphery. As the magnet current is further increased the trend reverses, the rf power consumption decreases with increased magnet current (by about 150 W), until a second transition point is reached at Imag about 0.4 A, marked by line 1112; this defines the second magnet current range R2. The magnet current at transition point 1112 corresponds to the critical magnetic field defined by envelope 1102 in FIG. 9A bounding Region #2. As detailed above, reduced rf power consumption in within this range may be attributed to plasma concentration in Region #2 away from the discharge chamber walls 118 and also away from the re-entrant plug walls. The trend reverses again at the transition point indicated by line 1112 in FIG. 9B and subsequent increase of the magnet current results in increased rf power consumption, over the magnet current range R3. In this range, which corresponds to the critical magnetic field in region #3 of FIG. 9A, increases in rf power with field strength are thought to be due to bottlenecking of the plasma by the re-entrant vessel and plasma losses to the walls.

In addition to illustrating different operating ranges of the electromagnet 200, FIG. 9B demonstrates that the second electromagnet meets a practical criterion for ion source enhancement, i.e. that the rf power consumption remains within practical limits when operated over its working range. In this case the rf power varied from the reference (0 A) by ~25% or less over an operating range from 0 to 1 A.

Referring now to FIG. 9C, an example of the effects of changing the magnet current in toroidal electromagnet 200 on the ion beam current density profile in the low to moderate magnetic field strength range are shown for the ion source configuration of FIG. 9A. The ion beam current density profile was measured according to known art using a linear array of Faraday cup probes located across a center axis of the ion beam in the substrate position, facing the ion source at normal incidence. The ion current readings in each of the Faraday cups directly correspond to the ion current density at that position. Measurements were made from the center of the beam and substrate to a radius of over 6 inches. For the following discussion, the primary etch region within 6" radius will be referred to when characterizing the ion beam current density profiles in terms of concave or convex. Unless otherwise indicated, the uniformity "U" is calculated as percentage (max−min)/(max+min), for all points measured over a diameter of 12.6 inches.

In FIG. 9C, the beam current density profiles are shown for a set of 1500 V beam parameters. In this case, when there is no electromagnet current the beam profile is strongly concave, as reflected in the ion beam current density distribution curve marked 1401. Increasing the magnetic field strength was initially found to make the ion beam profile progressively less concave (more convex). This is demonstrated for ion beam current density distribution curves obtained at different toroidal electromagnet currents of 0.02 A, 0.03 and 0.04 A, as indicated by curves 1402, 1403, and 1404, respectively. At a higher magnet current, 0.1 A, indicated by curve 1405, the effect has reversed and the profile has become more concave. Further increases in the magnet current up to 0.4 A (not shown) resulted in progressively more concave beam profiles. Consistent with the discussion of FIG. 9A, magnet currents up to at least 0.040 A in this case may be within the low magnet current range R1 where the weak magnetic field strength of electromagnet 200 is thought to concentrate plasma in Region #1 close to the discharge chamber wall 118, resulting in peripheral losses in the of the current density distribution, making the beam profile more convex. Transition to an intermediate magnet current range R2 between about 0.04 A and 0.1 A magnet current may have resulting in the plasma is directed more to the peripheral region of the beam, resulting in a more concave beam profile.

The results shown in FIG. 9C exhibit a capability of the toroidal electromagnet 200 to adjust the beam profile shape across a large beam area (over 12 inches compared to 6 inches diameter, for example). It particularly demonstrates the capability to improve ion beam current density uniformity over a large area starting from an initially strongly concave ion beam profile. Referring to the graph legend in the figure, the uniformity over 12.6 inches diameter of the strongly concave zero magnet current beam profile labeled curve 1401 is U=8.9%. Energizing magnet coil 260 and raising the current within the range R1 makes the profile more convex, initially improving the uniformity. The optimum uniformity obtained in this study was U=2.9%, reflected by curve 1403 (Imag=0.03 A), a 3× improvement.

Example results with both electromagnets (e.g., electromagnets 142, 200 of FIG. 1A) energized during operation according to one implementation of the invention are depicted in FIGS. 10A-10C.

FIG. 10A illustrates an example modeled representative magnetic vector field distribution map 1275 and several sets of magnetized electron trajectories for the dual electromagnet configuration of FIG. 1. FIG. 10A illustrates a partial cross-sectional view of a similar ion source to that of FIG. 6, wherein the magnetic vector field map 1275 and several sets of simulated 10 eV electron trajectories for electrons injected at different points in the primary ionization region 705 indicating the direction of plasma flow are depicted. The direction of the electrical current through the toroidal electromagnet coil 260 is counterclockwise whereas it is clockwise through the center electromagnet coil 172. The magnetic field map is generated with both electromagnets 142 and 200 energized at relatively high magnetic field strengths such that considerable overlap between the field lines of the individual magnets may be expected. However, for the above mentioned electromagnet polarities, the result in general is that the individual fields of the two electromagnets are additively reinforced and the direction and the strength of the magnetic field lines near each of the electromagnets is comparable to what it was when individually energized. For example, vector field path 1225 near the pole pieces 245A, 245B of electromagnet 200 is comparable to vector field path 725 similarly located in FIG. 6 and example electron trajectory set 1210, which follows vector field path 1250, is similar to trajectory set 1010 of FIG. 9A. In the discharge space between the two electromagnets, the field vectors add to form composite field paths which may direct electrons from the discharge region towards the center of the ion source, as indicated by electron trajectory set 1220. Increasing the magnetic field strength of electromagnet 200 at higher field strength may increase the plasma density near the periphery of the discharge space 142 and make the ion current density distribution at the substrate more concave, whereas increasing the magnetic field strength of electromagnet 142 at higher field strength may increase the plasma density near the center of the discharge space 124, making the ion current density distribution at the substrate more convex.

FIG. 10B illustrates an example of the effect of the modeled representative magnetic vector field distribution map 1275 and magnetized electron trajectories of FIG. 10A on the ion beam current density distribution, as measured using a Faraday cup probe array. Argon ion beam current density profiles and uniformities were measured over a radius of greater than 6 inches for a dual electromagnet ion source configured as described with reference to FIG. 10A. In this example, when the toroidal electromagnet 200 current "Itor" and the central electromagnet 142 current "Icen" are both zero (both electromagnets turned off), the ion beam current density profile is relatively flat over 12" diameter, as indicated by ion beam current density profile curve 1501. Energizing the toroidal electromagnet 200 with a moderate magnet current (Itor=0.2 A) increases the current density at the periphery of the beam and makes the ion profile significantly concave, even with the center electromagnet energized (Icen=0.1 A) as reflected by curve 1502. Maintaining the same moderate current through the coil 260 of the toroidal electromagnet and energizing the central electromagnet 142 progressively with higher magnet currents increases the ion beam current in the central region of the beam, making the profile less concave, or more convex, as reflected by curves 1503 (Icen=0.3 A) and 1504 (Icen=0.6 A) respectively. It is notable that changes in the central electromagnetic field strength in this range have no significant impact on the ion beam profile in the peripheral region, outside of a radius of about 4.5 inches. Thus, even when operated at relatively high magnetic field strengths wherein the magnetic field distributions from the two electromagnets are not localized, independent control of different regions of the plasma is possible. More specifically, toroidal electromagnet 200 can be used in the higher magnetic field regime to primarily to enhance the peripheral ion beam current density and make the profile more concave, while the center electromagnet 142 can be used to enhance the current density in the center of the ion beam and make the profile more convex. This combination provides a simple method with a wide range of flexibility to adjust the uniformity over a large beam diameter for different conditions.

FIG. 10B particularly demonstrates the capability to improve uniformity using the dual electromagnet method of FIG. 10A, even when the initial ion beam current density profile is relatively flat. Referring to the legend on the graph in FIG. 10B, the uniformity over 12.6 inches diameter obtained with both magnets turned off (indicated by curve 1501) is U=3.8%. After adjustments of the electromagnet currents, making the profile more concave and then more convex, a combination results in the ion beam current density profile reflected by curve 1504, wherein the uniformity, is 3.2%, about a 20% improvement from the condition with the electromagnets turned off.

FIG. 10C illustrates the effect of the modeled representative magnetic vector field distribution map 1275 and magnetized electron trajectories of FIG. 10A on the ion beam current density distribution for different beam voltages.

The uniformity of the beam current density was first optimized with electromagnets turned off, corresponding to conventional ion source operation with beam voltages of 100V, 1200V, and 1500V, respectively. FIG. 10C illustrates beam profiles for these same beam voltage conditions after turning on and optimizing the magnet currents in electromagnets 200 and 142. In each case, the beam profiles with the electromagnets turned on are more uniform than with the electromagnets turned off. In these examples the center electromagnet 142 was energized with a low magnet current (e.g., Icen=0.05 A) and then the peripheral electromagnet 200 current was adjusted in a very weak field range (e.g., Itor=0.0102-0.015 A). This made the profiles less concave (more convex) and essentially flat within a 6-inch radius, as reflected by the curves marked 1101, 1103, and 1105, for beam voltages of 100V, 1200V, and 1500V, respectively.

FIG. 10D compares the uniformity obtained for each of the beam profiles at optimized electromagnet current settings in FIG. 10C with the corresponding uniformity obtained with no current in the coils of the electromagnets. Here the uniformity of the ion current density distributions are calculated as the percentage of the range (max-min) divided by the mean value, for measurements across a 12.6 inch diameter of the beam. The presently disclosed dual electromagnet may improve the uniformity compared to the prior art by about 2× at 100V and about 3× at 1200 and 1500V beam conditions.

Another implementation of dual electromagnet operation is described below for FIGS. 11A and 11B.

FIG. 11A illustrates another example modeled representative magnetic vector field distribution map 1375 and several sets of magnetized electron trajectories for the dual electromagnet configuration of FIG. 1. As in FIG. 10A, electromagnets 142 and 200 are both energized to generate sufficient magnetic field strength such that there is considerable overlap between the field lines of the individual magnets. The electromagnet coil models, magnitude of electrical currents through the coils, and the direction of the electrical current through the toroidal electromagnet coil 260 in the magnetic field simulations of FIGS. 10A and 11A are also respectively similar. However, in FIG. 11A the direction of the electrical current through the center electromagnet coil 142 is counter clockwise, reversed from FIG. 10A. Near the pole pieces 245A, 245B of electromagnet 200 the vector field map shown in FIG. 11A is, like that shown in FIG. 10A, little different from that of the toroidal electromagnet alone, as shown in FIG. 6; this is shown for example by comparing the magnetic field paths labeled 1325, 1225 and 725 in FIGS. 11A, 10A, and 6, respectively. Outside of this region, vector field map 1375 in FIG. 11A is very different from the corresponding map 1275 in FIG. 10A, even near the poles of the central electromagnet 142. Of note is the absence of field lines, and thus paths for magnetized electrons, between the primary ionization region 705 and the center of the ion source in FIG. 11A. Plasma generated near the periphery of the primary ionization region 705 may be directed to the periphery of the ion source exit along electron trajectory paths such as 1320 or 1340, following vector field paths such as 1350 or 1370. Plasma generated closer to the axis of the ion source may be directed to the walls of the re-entrant vessel 144 adjacent to electromagnet 142, such as along the electron trajectory path 1360, following field line vector path 1390. This may lead to increasingly concave plasma density profiles in the discharge chamber and ion beam current density and etch profiles at the substrate as the current in the coil of either electromagnet 200 or 142 is increased.

FIG. 11B illustrates the effect of the example modeled representative magnetic vector field distribution map and magnetized electron trajectories of FIG. 11A on the ion beam current density distribution. Ion beam current density profile measurements are shown in FIG. 11B. With no current applied to the coils of either electromagnet, the ion flux is relatively flat within the 12" etch diameter, as indicated by ion beam current density profile curve 1601. Applying a moderately high toroidal electromagnet current (e.g., Itor=0.4 A) makes the ion beam current density profile decidedly concave, as reflected by curve 1602. Maintaining the moderately high toroidal magnet current and raising central electromagnet current progressively from low to medium to high (e.g., Icen=0.2, 0.4, 0.6) respectively further increases the concavity of the ion beam current density profile, as reflected in curves 1603, 1604, and 1605, respectively.

This implementation may be suitable for making large adjustments in the beam profile, and in particular increasing the concavity of the ion beam profile (e.g. improving uniformity in cases where the profile prior to energizing the electromagnets, or after some period of service, may be strongly convex). For example, curve 1605 in FIG. 11B reflects a greater than 10% increase in "concavity" from the no-electromagnet curve 1601 over a diameter of 100 mm. This is compared to a maximum of about 4% over the same diameter by prior art methods, discussed above (etch rate being directly proportional to the ion beam current density). Also, since in this case both electromagnets act to make the ion beam current density profile more concave, large adjustments in the beam profile can be made without operating either electromagnet at high magnetic field strength, which may help to avoid causing magnetic interference with the ion beam operation.

The embodiments of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. An ion source comprising:
    a discharge chamber with a discharge space adapted to contain a working gas, the discharge chamber including a closed end, an open end, and a tubular sidewall extending between the closed end and the open end;
    an antenna adapted to generate a plasma from the working gas inside the discharge space;
    a first electromagnet disposed at an outer periphery of the tubular sidewall of the discharge chamber for changing a distribution of the plasma inside the discharge space; and
    a controller to adjust a current applied to the first electromagnet, thereby changing the plasma distribution in a peripheral region of the discharge space and achieving improved ion beam current density uniformity during operation of the ion source.

2. The ion source of claim 1, further comprising:
    a second electromagnet disposed within the closed end of the discharge chamber for changing the plasma distribution inside the discharge space, wherein the second electromagnet includes a second magnetic flux concentrator and a second coil, the second magnetic concentrator adapted to shape a magnetic field generated by the second coil and concentrate it in a central region of the discharge space proximate to a center axis of the ion source between the closed end and the open end of the discharge chamber, the controller further to adjust a current applied to the second electromagnet, thereby changing the plasma distribution in the central region of the discharge space and achieving improved ion beam current density uniformity during operation of the ion source.

3. The ion source of claim 1, wherein the first electromagnet includes a first magnetic flux concentrator and a first coil, the first magnetic flux concentrator adapted to shape a magnetic field generated by the first coil and concentrate it in the peripheral region of the discharge space proximate to the tubular sidewall and the open end of the discharge chamber.

4. The ion source of claim 2, wherein the first and the second electromagnets are independently controlled and are each adapted to be azimuthally isotropic.

5. The ion source of claim 3, wherein the first magnetic flux concentrator includes a pair of spaced magnetically permeable magnetic flux concentrator plates, wherein an inner radius of the magnetic flux concentrator plates is adjacent to the plasma discharge chamber sidewall, faces of the magnetic flux concentrator plates are substantially perpendicular to a center axis of the ion source, and the first coil is disposed between the magnetic flux concentrator plates.

6. The ion source of claim 5, further comprising:
a pole piece assembly including a pair of spaced pole piece rings oriented between the spaced magnetic flux concentrator plates and the plasma discharge chamber side wall.

7. The ion source of claim 1, further comprising:
an azimuthally isotropic pair of magnetically permeable annular shunt pieces disposed between pole pieces of the first electromagnet, the annular shunt pieces attached to surfaces of the pole pieces facing each other and adjacent to the plasma discharge space.

8. The ion source of claim 7, wherein the annular shunt pieces include a multi-sectional array of individual shunt sections with differing characteristics for varying azimuthal magnetic field strength distribution.

9. The ion source of claim 1, wherein the first electromagnet includes two or more independently controlled electromagnets.

10. The ion source of claim 9, wherein the two or more independently controlled electromagnets are arranged azimuthally in a multi-sectional annular array around a perimeter of the discharge chamber.

11. The ion source of claim 3, wherein the first magnetic flux concentrator of the first electromagnet includes shaped pole pieces that generate a ring cusp magnetic field about a periphery of the discharge chamber.

12. The ion source of claim 1, further comprising:
at least one grid adjacent to the open end of the discharge chamber, the grid including an array of apertures, the grid adapted to extract ions from plasma in the discharge space through the apertures.

13. A method of operating an ion source comprising:
generating a plasma within a discharge chamber of the ion source, the discharge chamber including a discharge space filled with a working gas, the discharge chamber including a closed end, an open end, and a tubular sidewall extended between the closed end and the open end; and
adjusting a current applied to a first electromagnet disposed at an outer periphery of a tubular sidewall of the discharge chamber, thereby changing a plasma distribution in a peripheral region of the discharge space and achieving improved ion beam current density uniformity during operation of the ion source.

14. The method of claim 13, further comprising:
adjusting a current applied to a second electromagnet disposed within the closed end of the discharge chamber, thereby changing the plasma distribution in a central region of the discharge space and achieving improved ion beam current density uniformity during operation of the ion source.

15. The method of claim 14, wherein the first electromagnet and the second electromagnet are independently adjusted.

16. The method of claim 15, wherein independently adjusting the first and the second electromagnets includes independently controlling electrical currents applied to an individual electromagnet coil of each of first and the second electromagnets.

17. The method of claim 14, wherein a direction of current flow through a first coil of the first electromagnet is clockwise and a direction of current flow through a second coil of the second electromagnet is counterclockwise.

18. The method of claim 14, wherein a direction of current flow through a first coil of the first electromagnet is counterclockwise and a direction of current flow through a second coil of the second electromagnet is counterclockwise.

19. The method of claim 13, wherein an average electron gyro-radius of an electron trajectory set within the discharge chamber is less than one tenth of an inner diameter of the discharge chamber.

20. An ion source comprising:
a discharge chamber with a discharge space adapted to contain a working gas, the discharge chamber including a closed end, an open end, and a tubular sidewall extended between the closed end and the open end;
an antenna adapted to generate a plasma from the working gas inside the discharge space;
a first electromagnet disposed at an outer periphery of the tubular sidewall of the discharge chamber and adapted to change a distribution of the plasma in a peripheral region of the discharge space;
a second electromagnet disposed within the closed end of the discharge chamber and adapted to change a distribution of the plasma in a central region of the discharge space; and
a controller to independently adjust a current applied to the first electromagnet and the second electromagnet, thereby changing the plasma distribution in a central region and a peripheral region of the discharge space and achieving improved ion beam current density uniformity during operation of the ion source.

\* \* \* \* \*

UNITED STATES PATENT AND TRADEMARK OFFICE
CERTIFICATE OF CORRECTION

PATENT NO. : 10,128,083 B2  
APPLICATION NO. : 15/170570  
DATED : November 13, 2018  
INVENTOR(S) : Boris Druz et al.

Page 1 of 1

It is certified that error appears in the above-identified patent and that said Letters Patent is hereby corrected as shown below:

On the Title Page

Item (73) Assignee: Replace VEBCO INSTRUMENTS INC. with VEECO INSTRUMENTS INC.

Signed and Sealed this  
Tenth Day of December, 2019

Andrei Iancu  
*Director of the United States Patent and Trademark Office*